US011735352B2

(12) United States Patent
Clavette et al.

(10) Patent No.: US 11,735,352 B2
(45) Date of Patent: Aug. 22, 2023

(54) INDUCTOR DEVICES AND STACKED POWER SUPPLY TOPOLOGIES

(71) Applicant: Infineon Technologies Austria AG, Villach (AT)

(72) Inventors: Danny Clavette, Greene, RI (US); Gerald Deboy, Klagenfurt (AT); Roberto Rizzolatti, Villach (AT); Otto Wiedenbauer, Villach (AT); Yong Zhou, Providence, RI (US)

(73) Assignee: Infineon Technologies Austria AG, Villach (AT)

( * ) Notice: Subject to any disclaimer, the term of this patent is extended or adjusted under 35 U.S.C. 154(b) by 399 days.

(21) Appl. No.: 16/925,729

(22) Filed: Jul. 10, 2020

(65) Prior Publication Data

US 2022/0013276 A1    Jan. 13, 2022

(51) Int. Cl.
*H01F 27/24* (2006.01)
*H01F 27/28* (2006.01)
(Continued)

(52) U.S. Cl.
CPC ............. *H01F 27/28* (2013.01); *H01F 27/24* (2013.01); *H01F 41/0206* (2013.01);
(Continued)

(58) Field of Classification Search
CPC .......... H01F 17/04; H01F 17/06; H01F 27/24; H01F 27/28; H01F 3/10; H01F 3/14;
(Continued)

(56) References Cited

U.S. PATENT DOCUMENTS

2007/0159285 A1* 7/2007 Renaud ............... H01F 17/0006
                                                          336/200
2018/0218828 A1* 8/2018 Ishigaki .................... H01F 3/10
(Continued)

FOREIGN PATENT DOCUMENTS

DE    102006037003 A1    2/2008
JP       2007227914 A    9/2007
JP         4999028 B1    8/2012

OTHER PUBLICATIONS

Basic AC Electrical Generators_pp. 1-67_Jan. 2019.*
(Continued)

*Primary Examiner* — Timothy J Thompson
*Assistant Examiner* — Guillermo J Egoavil
(74) *Attorney, Agent, or Firm* — Armis IP Law, LLC

(57) ABSTRACT

According to one configuration, an inductor device comprises core material and at least a first electrically conductive path. The core material is fabricated from magnetically permeable material. The first electrically conductive path extends axially through the core material from a proximal end of the inductor device to a distal end of the inductor device. The core material is operable to confine first magnetic flux generated from first current flowing through the first electrically conductive path. The inductor device further includes a gap in the core material. The gap (gas or solid material) has a different magnetic permeability than the core material. Inclusion of the gap in the core material provides a way to tune an inductance of the inductor device and increase a magnetic saturation level of the inductor device. The core material includes any number of electrically conductive paths and corresponding gaps.

32 Claims, 17 Drawing Sheets

(51) Int. Cl.
*H01F 41/02* (2006.01)
*H01F 41/04* (2006.01)
*H05K 1/18* (2006.01)

(52) U.S. Cl.
CPC ............. *H01F 41/04* (2013.01); *H05K 1/185* (2013.01); *H05K 2201/1003* (2013.01)

(58) Field of Classification Search
CPC ...... H01F 41/0206; H01F 41/04; H01F 41/02; H01F 2003/106; H01F 2017/067; H05K 1/185; H05K 1/18; H05K 2201/1003
USPC .................................. 361/761; 336/178, 233
See application file for complete search history.

(56) References Cited

U.S. PATENT DOCUMENTS

2019/0295761 A1* 9/2019 Miyashita ............. H01F 27/306
2022/0367109 A1* 11/2022 Peluso .................... H01F 30/06
2022/0367111 A1* 11/2022 Peluso ............... H01F 41/0206

OTHER PUBLICATIONS

Ferrite Cores 2013 Catalog_pp. 1-69_by Magnetic_ 2013.*
Extended Search Report, EP 21 18 3895, dated Dec. 14, 2021, pp. 1-11.

* cited by examiner

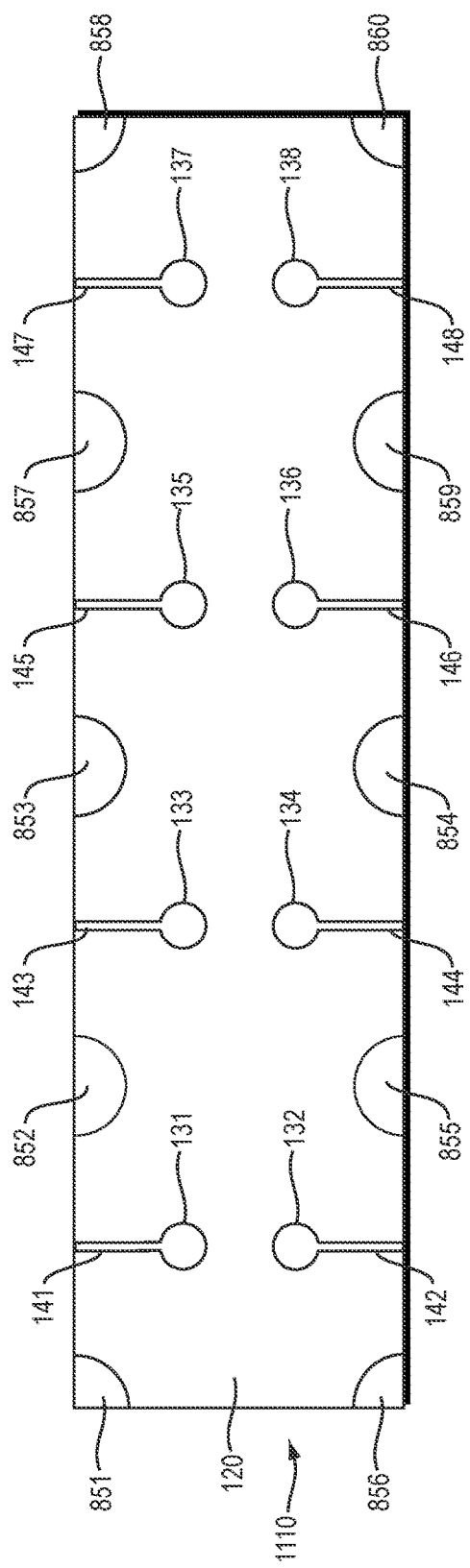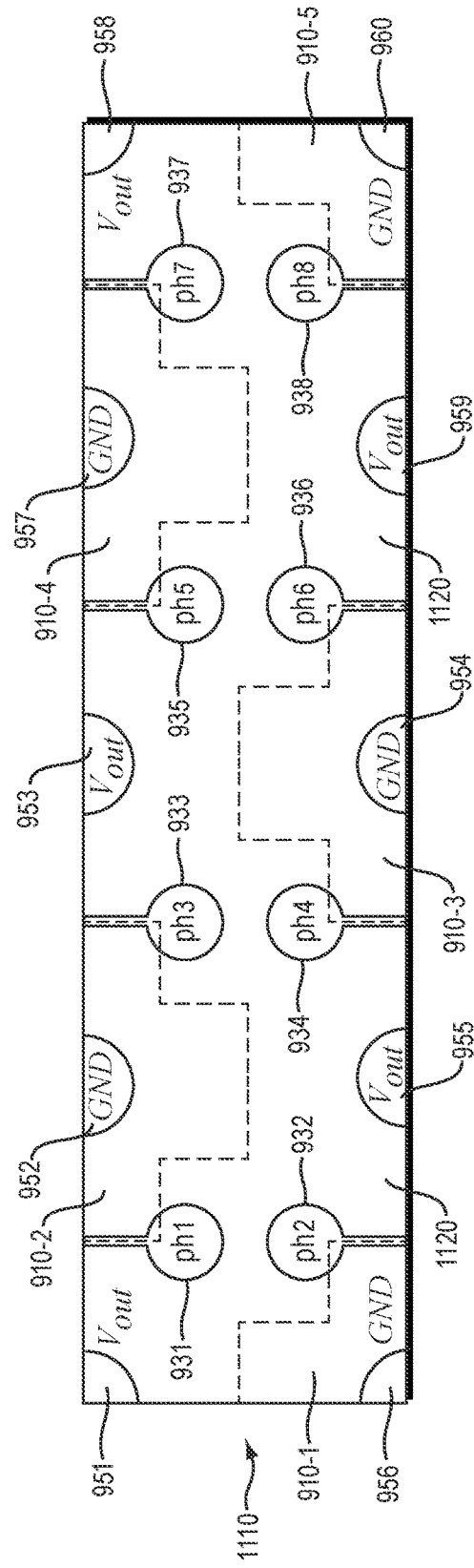

$$v_{L1} = L_{ph1}\frac{di_{ph1}}{dt} + M_{1,2}\frac{di_{ph2}}{dt} + M_{1,3}\frac{di_{ph3}}{dt}$$

$$v_{L2} = M_{1,2}\frac{di_{ph1}}{dt} + L_{ph2}\frac{di_{ph2}}{dt} + M_{2,3}\frac{di_{ph3}}{dt}$$

$$v_{L3} = M_{1,3}\frac{di_{ph1}}{dt} + M_{2,3}\frac{di_{ph2}}{dt} + L_{ph3}\frac{di_{ph3}}{dt}$$

INDUCTOR DEVICES AND STACKED POWER SUPPLY TOPOLOGIES

BACKGROUND

Conventional switching power supply circuits sometimes include an energy storage component such as an inductor to produce an output voltage that powers a load. For example, to maintain a magnitude of an output voltage within a desired range, a controller controls switching of current through one or more inductors to produce an output voltage that powers a load.

In general, a conventional inductor is a component comprising wire or other conductive material, which is shaped as a coil or helix to increase an amount of magnetic flux through a respective circuit path. Winding a wire into a coil of multiple turns is useful because it increases the number of respective magnetic flux lines in a respective inductor component, increasing the magnetic field and thus overall inductance of the respective inductor component.

BRIEF DESCRIPTION

This disclosure includes the observation that conventional inductor components are suited for planar circuit applications in which a respective planar surface of a power supply circuit board is populated with multiple different components that are, in turn, coupled to each other via circuit traces disposed on the planar surface. Such topologies (providing horizontal power flow in the power supply circuit board) inevitably make it difficult to create a compact, efficient, and high current output power supply circuit. Thus, conventional power supply circuits implementing one or more inductors via windings are sometimes undesirable.

In contrast to conventional techniques, embodiments herein provide novel and improved inductor components, inductor assemblies, power supplies, stacked circuit topologies, etc.

More specifically, one embodiment herein includes fabricating an N-phase inductor device (assembly), where the inductor device includes any number of N (N=1, 2, 3, 4, 5, 6, 7, . . . ) inductor phases. A fabricator receives core material that is magnetically permeable. The fabricator disposes at least a first electrically conductive path through the core material from a proximal end of the inductor device to a distal end of the inductor device. The magnetically permeable core material is operable to confine first magnetic flux generated from current flowing through the first electrically conductive path. The fabricator further fabricates the core material to include a gap, which has a different magnetic permeability than the core material. The gap serves to control magnitude flux in the core material during conditions in which current flows through the first electrically conductive path.

Note that the core material can be fabricated from any suitable material. In one embodiment, the core material is fabricated from flakes of ferrite material through which the one or more electrically conductive paths are fabricated.

The gap (portion) in the core material can be fabricated as a void (such as an air gap, vacuum, etc.) of magnetically permeable material. Alternatively, the core material is a first magnetically permeable material and the gap is second magnetically permeable material.

Yet further embodiments herein include fabricating the inductor device to include at least a second electrically conductive path in the core material. The second electrically conductive path extends through the core material from the proximal end of the inductor device to the distal end of the inductor device similar to the first electrically conductive path. The core material is operable to confine second magnetic flux generated from second current flowing through the second electrically conductive path.

In yet further example embodiments, the first electrically conductive path is a first inductor phase of an N-phase direct coupled inductor device; the second electrically conductive path is a second inductor phase of the N-phase direct coupled inductor device.

In still further example embodiments, the core material has a relative magnetic permeability of greater than 80. Although this can vary depending on the embodiment.

In yet further example embodiments, via placement of the gap in the core material, a magnetic coupling factor between the first electrically conductive path and the second electrically conductive path is less than 10%.

In accordance with further example embodiments, wherein the gap controls a magnetic coupling factor between the second electrically conductive path and the first electrically conductive path.

In accordance with still further embodiments, the fabricator fabricates a pair of electrically conductive paths through the core material. For example, the fabricator produces the inductor device to further include a second electrically conductive path to extend through the core material from the proximal end of the inductor device to the distal end of the inductor device; the second electrically conductive path is adjacent (such as parallel) to the first electrically conductive path. The fabricator produces the inductor device to include one or more gaps (such as a first gap and a second gap) in the inductor device to control respective parameters (such as inductance, saturation threshold value, etc.) associated with the electrically conductive paths (inductive paths).

In one embodiment, the fabricator produces the first gap to extend radially outward from the first electrically conductive path in a first direction; the fabricator produces the second gap to extend radially outward from the second electrically conductive path in a second direction opposite the first direction. Presence of the gaps (one or more regions or volumes of the core material having a different magnetic permeability than the core material) controls parameters of the inductive paths (first electrically conductive path and second electrically conductive path) such as the inductance of each inductive path, saturation threshold associated with each of the inductive paths, magnetically coupling between the first inductive path and the second inductive path, and so on.

In yet further example embodiments, the fabricator produces the gap to cross a concentric path in the core material around the first electrically conductive path. According to the right hand rule, the concentric path conveys magnetic flux generated by current through the first electrically conductive path. The fabricator controls fabrication of dimensions (such as thickness, volume, placement, etc.) associated with the gap to tune parameters such as inductance, magnetic saturation threshold, magnetic coupling, etc., associated with the respective inductive path (i.e., electrically conductive path).

As previously discussed, embodiments herein include fabricating the inductor device to include a second electrically conductive path extending from the proximal end to the distal end of the inductor device. In one embodiment, the second electrically conductive path is a return path operable to convey the first current or less-than-all portion of the first current conveyed through the first electrically conductive path.

Further embodiments herein include fabricating a pair of electrically conductive paths in the core material, the pair including the first electrically conductive path and at least a second electrically conductive path. The fabricator disposes a set of one or more electrically conductive paths around a periphery of the pair of electrically conductive paths. Similar to the first electrically conductive path and the second electrically conductive path, the set of one or more electrically conductive paths extends from the proximal end to the distal end of the inductor device as well.

If desired, as described herein, the inductor device as described herein can include an odd number of electrically conductive paths (inductive paths).

Still further embodiments herein include fabricating the inductor device (a.k.a., inductor assembly) to include pairs of electrically conductive paths (inductive paths). For example, in one embodiment, the fabricator fabricates a first pair of electrically conductive paths (such as first electrically conductive path and second electrically conductive path) in the core material. The second electrically conductive path is spaced apart from the first electrically conductive path. Each of the electrically conductive paths in the first pair extend from the proximal end to the distal end of the inductor device. The fabricator fabricates a second pair of electrically conductive paths in the core material. Each of the electrically conductive paths in the second pair extends from the proximal end to the distal end. The fourth electrically conductive path is spaced apart from the third electrically conductive path. The second pair of electrically conductive paths include a third electrically conductive path and a fourth electrically conductive path. The fabricator produces the inductor device to include a gap at least partially extending between the second electrically conductive path and the third electrically conductive path.

In yet further embodiments, the inductor device is part of a power converter that powers a respective load. In one embodiment, a circuit fabricator receives a substrate (such as a circuit board). The circuit fabricator receives the inductor device (a first circuit component) as previously discussed. The circuit fabricator affixes the first circuit component to the substrate. The circuit board fabricator receives a second circuit component (such as a load). The circuit board fabricator affixes the second circuit component to the first circuit component. During power converter operation, a power supply controller on the circuit board controls conveyance of current through the inductor device (one or more inductive paths formed via electrically conductive paths) from one or more voltage sources to produce an output voltage that powers the second circuit component (load).

These and other more specific embodiments are disclosed in more detail below.

Note that any of the resources (such as a fabricator) implemented in system as discussed herein can include one or more computerized devices, controllers, mobile communication devices, handheld or laptop computers, or the like to carry out and/or support any or all of the method operations disclosed herein. In other words, one or more computerized devices or processors can be programmed and/or configured to operate as explained herein to carry out the different embodiments as described herein.

Yet other embodiments herein include software programs to perform the steps and operations summarized above and disclosed in detail below. One such embodiment comprises a computer program product including a non-transitory computer-readable storage medium (i.e., any computer readable hardware storage medium) on which software instructions are encoded for subsequent execution. The instructions, when executed in a computerized device (hardware) having a processor, program and/or cause the processor (hardware) to perform the operations disclosed herein. Such arrangements are typically provided as software, code, instructions, and/or other data (e.g., data structures) arranged or encoded on a non-transitory computer readable storage medium such as an optical medium (e.g., CD-ROM), floppy disk, hard disk, memory stick, memory device, etc., or other a medium such as firmware in one or more ROM, RAM, PROM, etc., or as an Application Specific Integrated Circuit (ASIC), etc. The software or firmware or other such configurations can be installed onto a computerized device to cause the computerized device to perform the techniques explained herein.

Accordingly, embodiments herein are directed to a method, system, computer program product, etc., that supports operations as discussed herein.

One embodiment includes a fabricator such as including computer readable storage medium and/or system having instructions stored thereon to fabricate an inductor device. The instructions, when executed by computer processor hardware, cause the computer processor hardware (such as one or more co-located or disparately located processor devices or hardware) to: receive core material, the core material being magnetically permeable material; dispose a first electrically conductive path through the core material from a proximal end of the inductor device to a distal end of the inductor device, the core material operable to confine first magnetic flux generated from current flowing through the first electrically conductive path; and fabricate the core material to include a gap, the gap having a different magnetic permeability than the core material.

The ordering of the steps above has been added for clarity sake. Note that any of the processing steps as discussed herein can be performed in any suitable order.

Other embodiments of the present disclosure include software programs and/or respective hardware to perform any of the method embodiment steps and operations summarized above and disclosed in detail below.

It is to be understood that the system, method, apparatus, instructions on computer readable storage media, etc., as discussed herein also can be embodied strictly as a software program, firmware, as a hybrid of software, hardware and/or firmware, or as hardware alone such as within a processor (hardware or software), or within an operating system or a within a software application.

Note further that although embodiments as discussed herein are applicable to switching power supplies, the concepts disclosed herein may be advantageously applied to any other suitable topologies.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of embodiments herein (BRIEF DESCRIPTION OF EMBODIMENTS) purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section (which is a summary of embodiments) and corresponding figures of the present disclosure as further discussed below.

BRIEF DESCRIPTION OF THE DRAWINGS

FIG. 11A is an example diagram illustrating a cross-sectional view of an inductor device according to embodiments herein.

FIG. 11B is an example diagram illustrating a view of pads of an inductor device according to embodiments herein.

Figure 1:
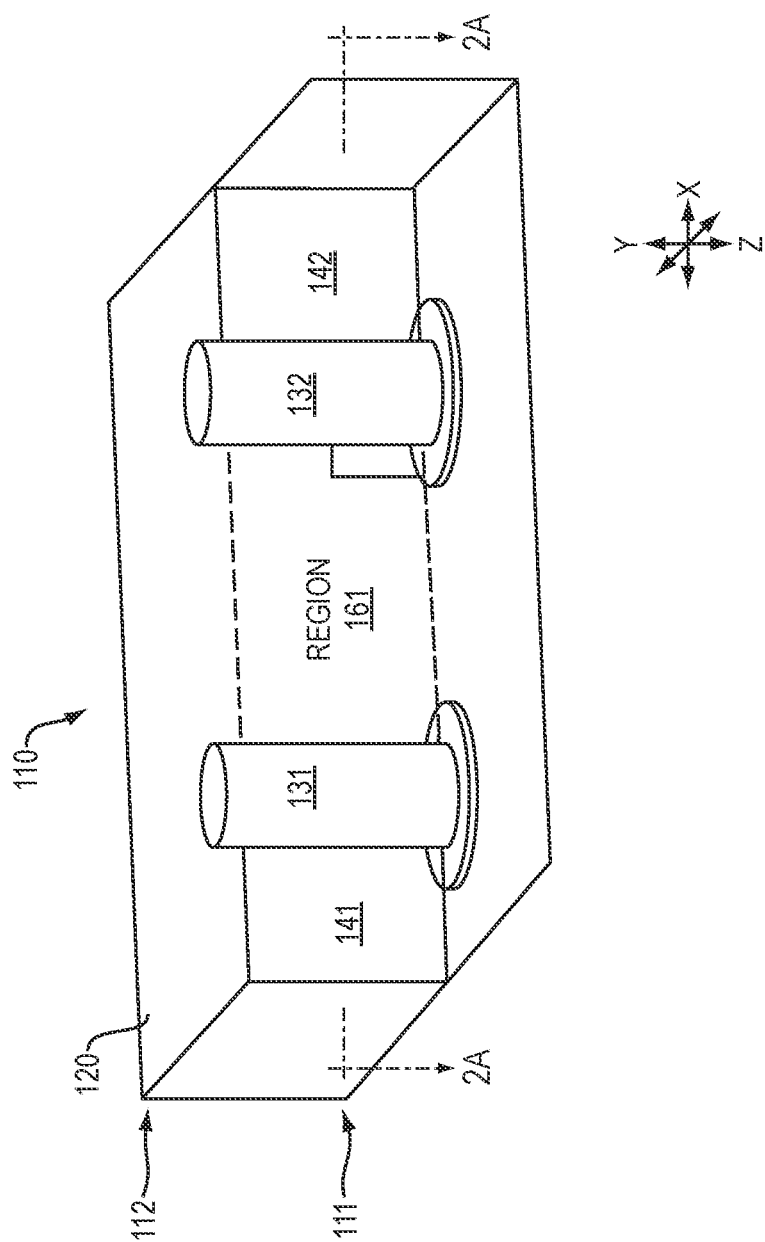
FIG. 1 is an example diagram illustrating a three-dimensional (see-through) view of an inductor device including multiple inductive paths according to embodiments herein.

The foregoing and other objects, features, and advantages of embodiments herein will be apparent from the following more particular description herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

Certain embodiments herein are directed to power conversion stages powering computing processors from a DC input voltage. Due to high power demand, very high dynamic load changes, narrow tolerances of the produced output voltage the power stage needs to be positioned at minimum physical distance to the load. Embodiments herein include a vertical power flow stacking power stage and magnetic elements below the processor within an active substrate or alternatively an interposer or alternatively a PCB board.

In state-of-the-art, a voltage regulator module (VRM) is arranged laterally to the load with power stages and magnetic elements being placed as Surface Mount Device (SMD) on a motherboard.

The proposed magnetic device (inductor device) as described herein enables:

High power density close to the digital load→reduction in losses in the PDN (Power Delivery Network).

Improved transient performance

Reduction of copper losses in the magnetic device

By using high permeability material (i.e., relative permeability, $\mu\_r>80$) in the core material of inductor device, it is possible to shape the flux and therefore design the magnetic device in an advantageous way. Flux cancellation as described herein results in reduction of core losses or reduction of magnetic material volume (i.e., because it is possible to shrink certain part of the core). In one embodiment, presence of the gap as described herein reduces an effective permeability in the core material and modifies an inductance of the inductor device Additionally, some applications can benefit from low coupling between inductances built in the same core. Placement of one or more (air) gaps in the core material reduces the coupling factor between phases to reduce system losses. Direct coupling can be used to improve transient. No direct link to increased copper losses, this simplified the statement to reduce system losses.

Now, with reference to the drawings, FIG. 1 is an example diagram illustrating a three-dimensional (see-through) view of an inductor device according to embodiments herein.

As shown, the inductor device 110 in FIG. 1 includes: core material 120 and electrically conductive paths 131 and 132. As further discussed herein, the core material 120 can include any number of electrically conductive paths extending at least from the proximal end 111 to the distal end 112.

In one embodiment, each of the electrically conductive paths 131 and 132 extends axially (such as along y-axis or straight, non-winding, etc.) through the core material 120. As further discussed herein, inductance of each electrically conductive paths 131, 132, etc., arises from presence of the surrounding core material 120 (magnetically permeable material) as opposed to conventional windings.

In general, core material 120 envelops (surrounds) each of the conductive paths 131 and 132 with the exception of gap 141 associated with electrically conductive path 131 (such as phase ph1) and gap 142 associated with electrically conductive path 132 (such as phase ph2). There may be a small gap between the electrically conductive paths and the corresponding core material 120.

Note that the core material 120 can be fabricated from any suitable material. In one embodiment, the core material 120 is a solid block of material fabricated from flakes of ferrite material through which the one or more electrically conductive paths are fabricated.

The core material 120 can have any suitable magnetic permeability. In one embodiment, by way of non-limiting example embodiment, the core material 120 has a flux permeability between 25-350 Henries/meter. In one embodiment, as previously discussed, any material with relative permeability $\mu\_r$ higher than 80 can be used to fabricate the inductor device 110.

In yet further example embodiments, the inductance of each electrically conductive path (131, 132, etc.) is defined by the corresponding air gap (141, 142, etc.) length and area, and by the magnetic permeability of the core material 120.

In yet further embodiments, each of the electrically conductive paths 131, 132, etc., in core material 120 is made from any suitable conductive material such as metal, metal alloy, etc.

Presence of the electrically conductive paths 131 and 132 in the core material 120 as shown transforms the conductive path 131 into a first inductive path and transforms the conductive path 132 into a second inductive path. Thus, the inductor device 110 includes multiple inductors. In one embodiment, little or no coupling is desired.

If desired, an outer surface of each of the conductive paths 131 and 132 is surrounded with a layer of insulative material or air gap (such as non-electrically conductive material so as not to come in contact with the core material 120). Alternatively, each of the electrically conductive paths are in contact with the core material 120. Additional details of the inductor device 110 are shown in the following drawings.

Figure 2A:
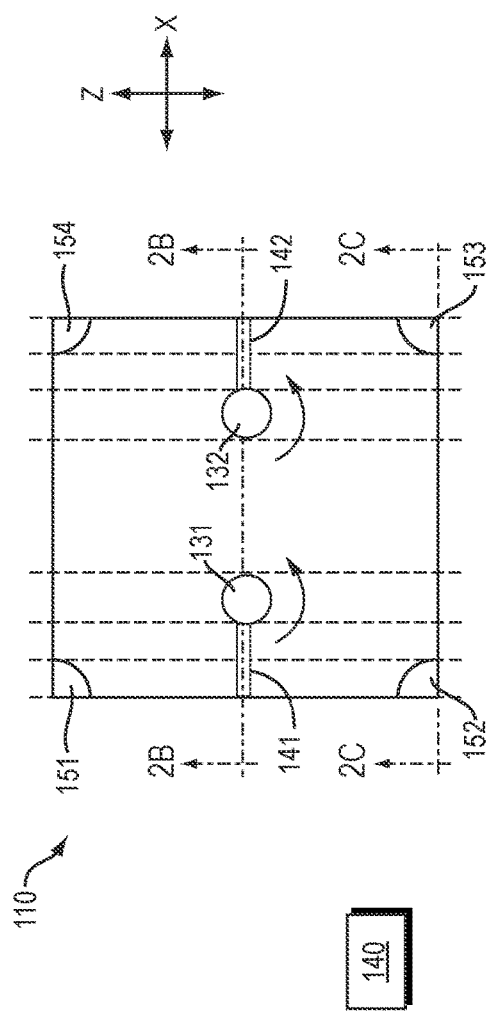
FIG. 2A in an example diagram illustrating a top view of an inductor device according to embodiments herein.

FIG. 2A in an example diagram illustrating a top view of an inductor device according to embodiments herein.

In this example embodiment, the fabricator 140 produces the inductor device 110 to include electrically conductive paths 131 and 132 as well as corresponding gaps 141 and 142 as previously discussed.

As further shown, the fabricator 140 produces the inductor device 110 to include a set of one or more additional electrically conductive paths 151, 152, 153, and 154 that serve as current return paths, voltage sense paths, etc., (a.k.a., electrically conductive return paths fabricated from metal). In one embodiment, the electrically conductive paths 151, 152, 153, and 154 are disposed about a periphery around or about the combination of electrically conductive paths 131 and 132.

In one embodiment, the return paths 151, 152, 153, and 154 are operable to convey all or a less-than-all portion of the first current conveyed through the first electrically conductive path 131 and all or a portion of the second current conveyed through the second electrically conductive path 132.

In this example embodiment, a fabricator 140 receives core material 120, which is magnetically permeable. The fabricator disposes at least a first electrically conductive path 131 through the core material 120 from a proximal end 111 of the inductor device 110 to a distal end of the inductor device 110.

Each of the conductive paths 131 and 132 can be fabricated in any suitable manner. In one embodiment, fabrication via fabricator 140 includes drilling a respective hole through the core material 120 and inserting a respective electrically conductive path in the corresponding void for each electrically conductive path included in the inductor device 110.

Electrically conductive paths 131 and 132 can be fabricated as any suitable shape such as rod-shaped, cylindrical-shaped, pillar-shaped, curve-shaped, ring-shaped, split ring shaped, etc.

In one embodiment, each of the electrically conductive paths is a non-winding circuit path such as extending axially (such as along the y-axis) through the core material 120.

Each of the respective gaps 141 and 142 can be fabricated in any suitable manner. In one embodiment, fabrication includes removal (such as drilling, etching, etc.) of a portion of the core material 120 to produce a respective void. For example, each of the gaps (portions, regions, etc.) in the core material 120 can be fabricated as a void (such as an air gap filled with a gas, liquid, solid, vacuum, etc.). Alternatively, the core material 120 is fabricated from a first magnetically permeable material and each of the one or more gaps is fabricated from second magnetically permeable material.

In one embodiment, the magnetic permeability of each of the gaps 141 and 142 is substantially less than a magnetic permeability of the core material 120.

Note that the shape of the gaps can vary depending on the embodiment. Each of the gaps in the core material 120 extends at least from the proximal end 111 to the distal end 112 and potentially further.

In one embodiment, each of the gaps 141 and 142 represents a slice of the core material 120. A thickness of the gap can be a fixed value. Additionally, or alternatively, the thickness of each of the gaps may vary depending upon the distance from the corresponding electrically conductive path to which it belongs.

During flow of current through the electrically conductive path 131 from the proximal end 111 to distal end 112, or vice versa, the magnetically permeable core material 120 confines corresponding first magnetic flux generated from current flowing through the respective electrically conductive path 131.

During flow of current through the electrically conductive path 132 from the proximal end 111 to distal end 112, or vice versa, the magnetically permeable core material 120 confines corresponding first magnetic flux generated from current flowing through the respective electrically conductive path 132.

As previously discussed, the fabricator 140 can be configured to fabricate each of the gaps to be of different magnetic permeability than a permeability of the core material 120.

In one embodiment, the fabricator 140 produces the first gap 141 to extend radially outward from the first electrically conductive path 131 in a first direction (such as to the left); the fabricator 140 produces the second gap 142 to extend radially outward from the second electrically conductive path 132 in a second direction (such as to the right) opposite the first direction.

Presence of the gaps (one or more regions or volumes of the core material 120 having a different magnetic permeability than the core material 120) controls parameters of the respective inductive paths (first electrically conductive path and second electrically conductive path) such as the inductance of each inductive path, saturation threshold associated with each of the inductive paths, magnetically coupling between the first inductive path and the second inductive path, and so on.

In the region 161 between the electrically conductive path 131 and electrically conductive path 132 (such as anywhere between P2 and P6), flux cancelation occurs, making it possible to reduce the size of the inductor paths (a.k.a., electrically conductive paths). Due to low flux density at the respective corners of core material 120 as achieved via presence of the gaps in core material 120, it is possible to keep the same area of the device and introducing retuning paths for the load current.

As described herein, each of the gaps serve to control magnetic flux in the core material 120 during conditions in which current flows through a respective electrically conductive path. In one embodiment, presence of the gaps 141 and 142 hinders a flow of magnetic flux through the core material 120. Presence of the gaps and proper placement as described herein results in: i) reducing an inductance associated with a respective electrically conductive path, ii) increasing a magnetic flux saturation level associated with a respective electrically conductive path, and iii) reducing magnetic coupling between the first electrically conductive path 131 and the second electrically conductive path 132.

Accordingly, the fabricator 140 as described herein produces the inductor device 110 to include one or more gaps (such as a first gap and a second gap) to control respective parameters (such as inductance, saturation threshold value, magnetic coupling, etc.) associated with the electrically conductive paths (a.k.a., inductive paths).

Figure 2B:
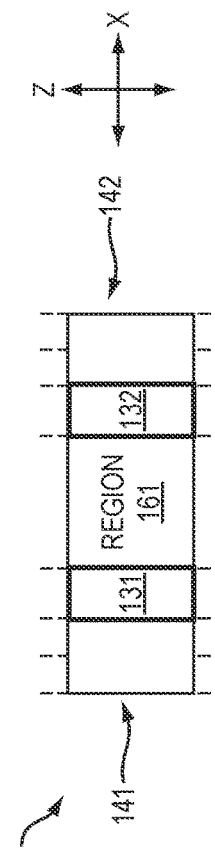
FIG. 2B is an example cutaway side view of an inductor device according to embodiments herein.

FIG. 2B is an example cutaway side view of an inductor device according to embodiments herein.

As shown in this example side view embodiment, between P4 and P5 of the x-axis, gaps are absent from region 161 between the electrically conductive path 131 and electrically conductive path 132. Gap 141 is present between P1 and P3 with respect to the X-axis. Gap 142 is present between P6 and P8. Electrically conductive path 131 is present between P3 and P4. Electrically conductive path 132 is present between P5 and P6.

Figure 2C:
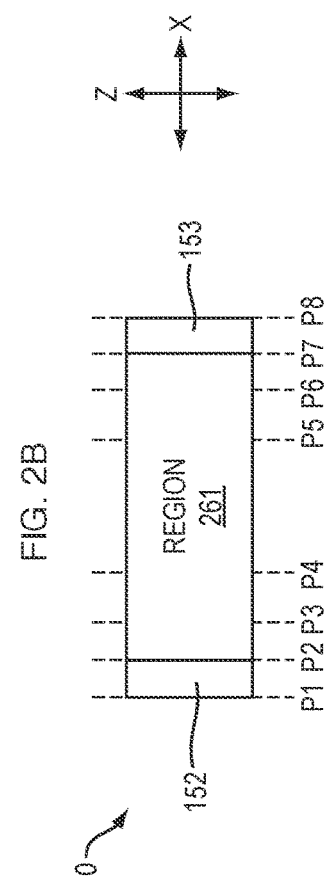
FIG. 2C is an example side view of an inductor device according to embodiments herein.

FIG. 2C is an example side view of an inductor device according to embodiments herein.

As shown in this example side view embodiment, side view of electrically conductive path 152 is present between P1 and P2; side view of electrically conductive path 153 is present between P7 and P8. Core material 120 is present in the side view region 261 between P2 and P7.

As further discussed herein, the inductor device 110 (such as electrically conductive path and corresponding gaps in core material 120) can be duplicated and disposed in a package including multiple pairs of electrically conductive paths.

For example, due to the simple magnetic structure (very low coupling factor between phases on the same core) associated with inductor device 110, a multi-phase implementation of inductor device 110 can be realized with a simple array arrangement of the single primitive (pair of electrically conductive paths 131 and 132 in the inductor device 110).

Multiphase composed by number of phases $N\_ph=2*(N\_x)*[(N)]\_y$ (where $N\_x$ and $N\_y$ are integer numbers $\geq 1$).

If an odd number of inductors is needed for a respective implementation, it is possible to add in the array structure also a single inductor then: i) the flux cancellation benefit is lost in that single inductor, increasing the size, and ii) multiphase composed by number of phases $N\_ph=2*(N\_x)*[(N)]\_y)+1$ (where $N\_x$ and $N\_y$ are integer numbers $\geq 1$).

Figure 3:
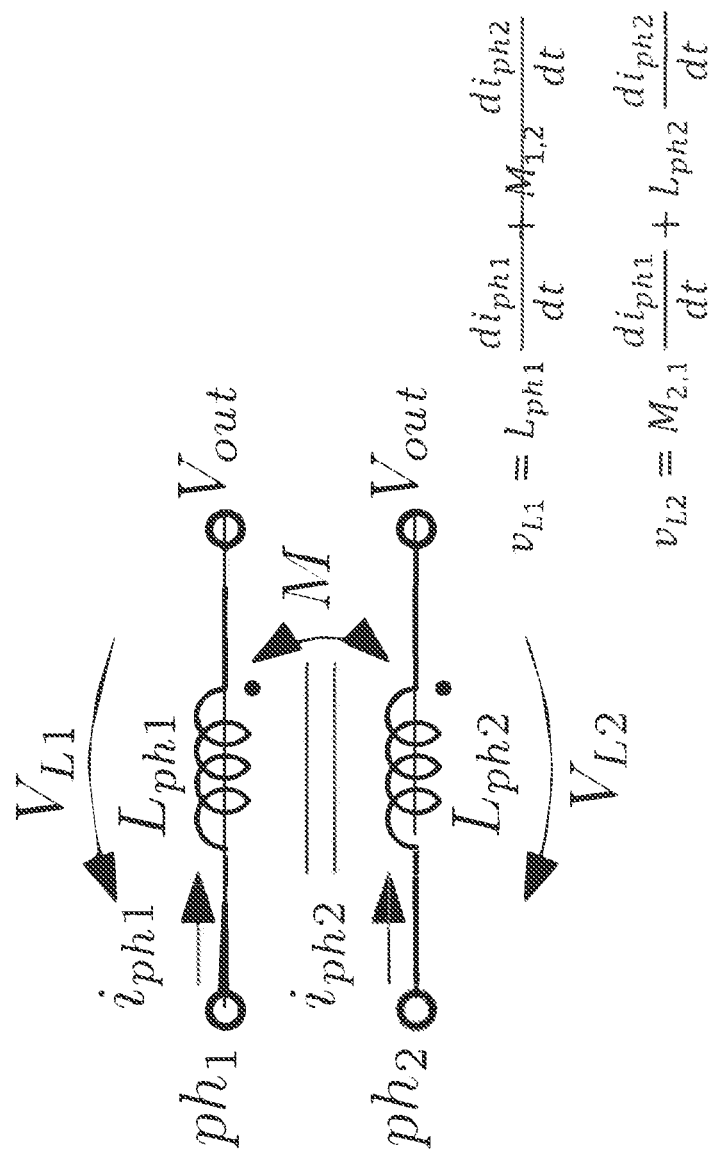
FIG. 3 is an example diagram illustrating attributes of an inductor device according to embodiments herein.

FIG. 3 is an example diagram illustrating attributes of an inductor device according to embodiments herein.

In this example embodiment, M (a magnetic coupling factor between the electrically conductive path 131 and electrically conductive path 132) is greater than 0, causing some amount of direct coupling between phases (electrically conductive path 131 and electrically conductive path 132).

In one embodiment, it is desirable that value of M is kept below a threshold value because a high value of M increases RMS current in the respective inductor. Coupling can be used to increase transient response.

With a low value of coupling factor (i.e., $M\_1,2/L]\_ph1$ or $[M\_2,1/L]\_ph2$) the current shape, and therefore the RMS current, is practically defined by the auto inductance $L\_ph1$ and $L\_ph2$, where $L\_ph1$ is the inductance of the electrically conductive path 131 and $L\_ph2$ is the inductance of the electrically conductive path 132.

The magnitude of $L\_ph1$ and $L\_ph2$ are defined by attributes of respective outer leg gaps 141 and 142 (such as area, volume, length, etc. of the gap).

The gaps 141 and 142 are disposed outside of the region 161 between the electrically conductive path 131 and electrically conductive path 132 to achieve the equivalent electric circuit here presented in FIG. 3.

Figure 4:
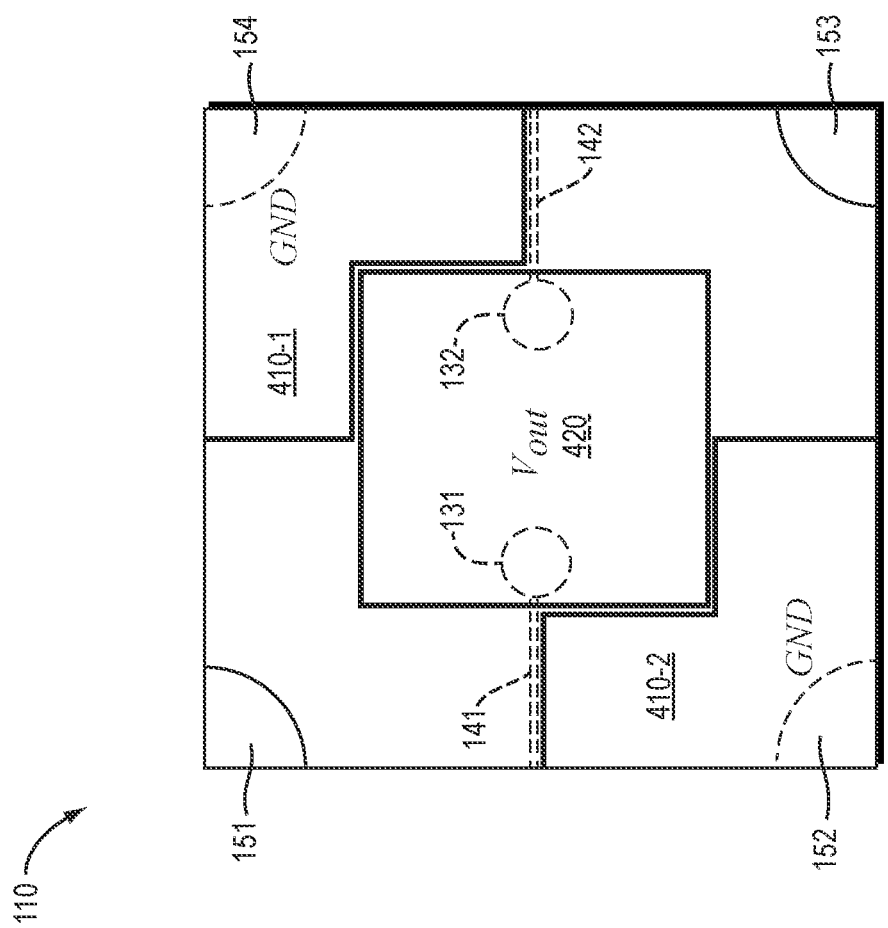
FIG. 4 is an example diagram illustrating a top view of pads of an inductor device according to embodiments herein.

FIG. 4 is an example diagram illustrating a top view of pads of an inductor device according to embodiments herein.

As shown in this example embodiment, fabricator 140 produces the inductor device 110 to include multiple conductive pads (fabricated from metal, metal alloy, etc.) at the distal end 112 to facilitate connectivity of the inductor device 110 with a respective circuit.

More specifically, in this example embodiment, the fabricator 140 couples/connects the conductive pad 410-1 (such as a ground pad) to the distal end 112 of the electrically conductive path 154. The fabricator 140 couples/connects the conductive pad 410-2 (such as a ground pad) to the distal end 112 of the electrically conductive path 152. The fabricator 140 couples/connects the conductive pad 420 (such as supplying an output voltage) to the distal end 112 of the electrically conductive path 131 and electrically conductive path 132.

Figure 5:
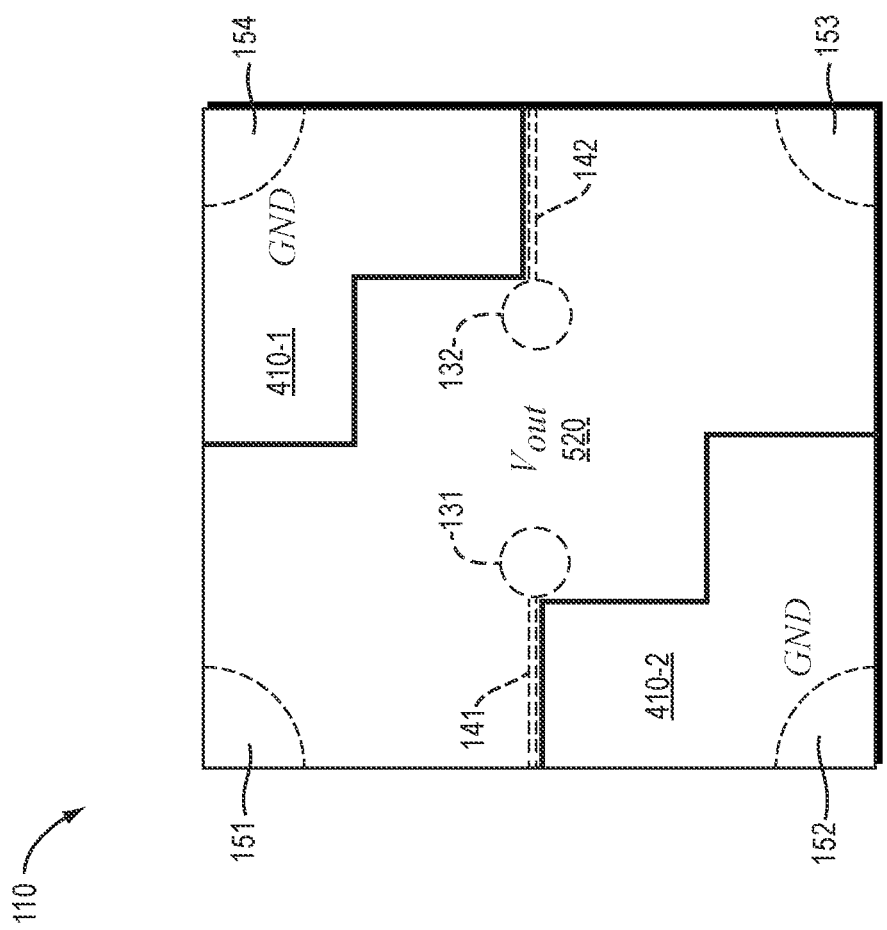
FIG. 5 is an example diagram illustrating a top view of pads of an inductor device according to embodiments herein.

FIG. 5 is an example diagram illustrating a top view of pads of an inductor device according to embodiments herein.

To reduce the equivalent ESR on the output caps and reduce the voltage ripple on the output, the returning path can be implemented to convey the output voltage, Vout, back to proximal located capacitors in order to minimize the AC current return path to ground.

As shown in this example embodiment, fabricator 140 produces the inductor device 110 to include multiple conductive pads (fabricated from metal, metal alloy, etc.) at the distal end 112 to facilitate connectivity of the inductor device 110 with a respective circuit.

More specifically, in this example embodiment, the fabricator 140 couples/connects the conductive pad 410-1 (such as a ground pad) to the distal end 112 of the electrically conductive path 154. The fabricator 140 couples/connects the conductive pad 410-2 (such as a ground pad) to the distal end 112 of the electrically conductive path 152.

The fabricator 140 couples/connects the conductive pad 520 (such as supplying an output voltage) to the distal end 112 of the electrically conductive path 131 and electrically conductive path 132. Additionally, the fabricator 140 couples/connects the conductive pad 520 (such as supplying an output voltage through electrically conductive paths 131 and 132) to the distal end 112 of the electrically conductive path 151 and electrically conductive path 154. In one embodiment, electrically conductive paths 151 and 154 then convey the output voltage Vout from the distal end 112 to the proximal end 111 of the inductor device 110.

Figure 6:
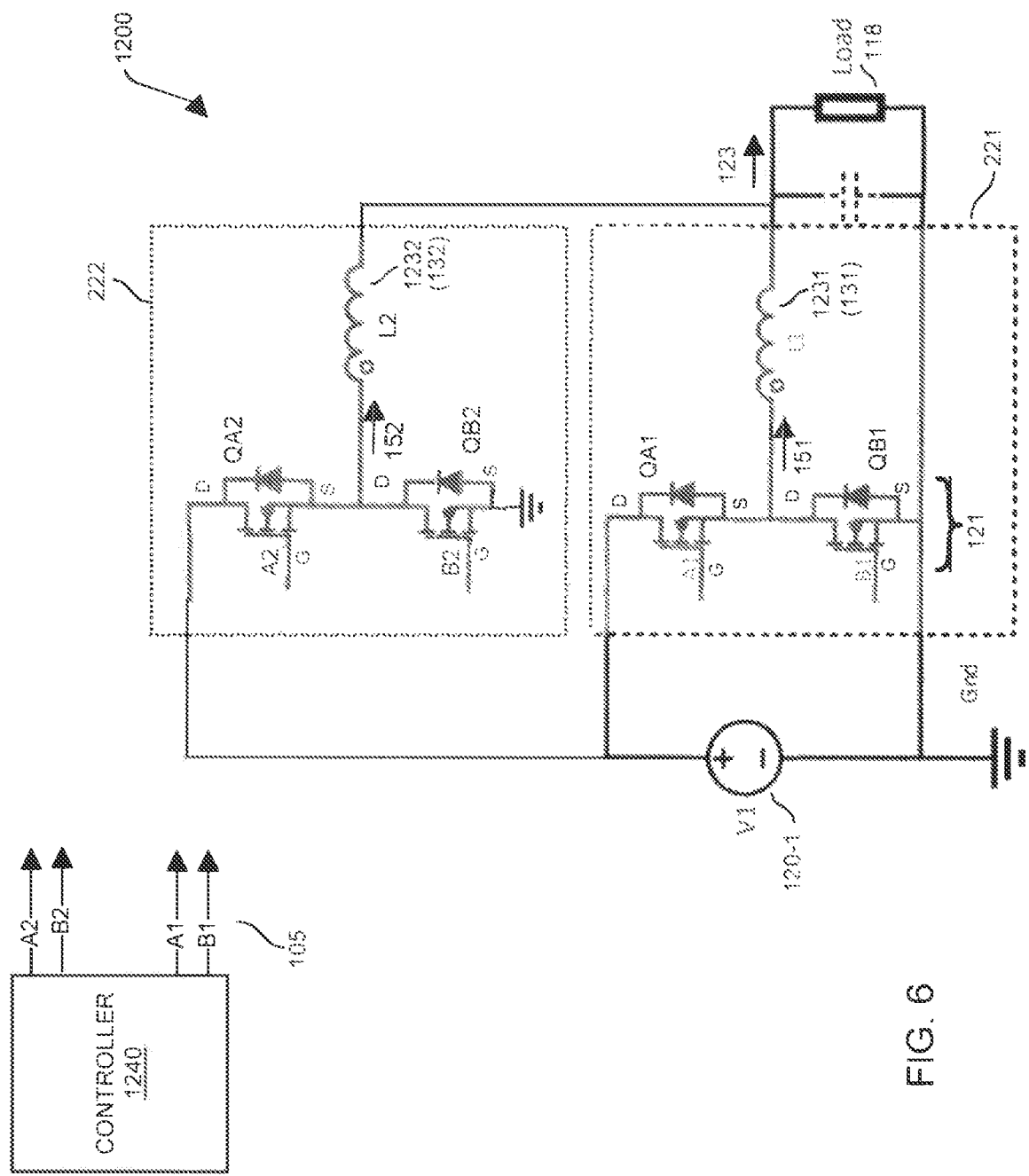
FIG. 6 is an example diagram illustrating connectivity of circuit components in a power supply according to embodiments herein.

FIG. 6 is an example diagram illustrating connectivity of circuit components in a power supply according to embodiments herein.

In this non-limiting example embodiment, the power supply 1200 includes controller 1240 and multiple phases 221 (ph1) and 222 (ph2) that collectively generate a respective output voltage 123 (output current) to power load 118. Note that the load 118 can be any suitable circuit such as CPUs (Central Processing Units), GPUs (Graphics Processing Units) and ASICs (Application Specific Integrated Circuits such as those including one or more Artificial Intelligence Accelerators), etc., which can be located on standalone circuit board.

Note further that power supply 1200 in this example embodiment can include any number of phases. By way of non-limiting example embodiment, the power supply 1200 includes two phases powering the load 118 for sake of illustration. If desired, the phases can be split such that the first phase 221 powers a first load independent of the second phase powering a second load.

As shown in the example embodiment of operating a combination of the phase 221 and phase 222 to power the same load 118, phase 221 includes switch QA1 (first high side switch circuitry), switch QB1 (first low side switch circuitry or control switch circuitry), and inductive path 1231 (such as electrically conductive path 131). Phase 222 includes switch QA2 (high side switch circuitry), switch QB2 (low side switch circuitry), and inductive path 1232 (electrically conductive path 132).

Further in this example embodiment, the voltage source 120-1 supplies voltage V1 (such as input voltage 6 VDC or any suitable voltage) to the series combination of switch QA1 (such as a high-side switch) and switch QB1 (such as a low-side switch).

In one embodiment, the combination of switch QA1 and QB1 as well as inductive path 1231 (electrically conductive path 131) operate in accordance with a buck converter topology (such as each phase out of phase with respect to each other) to produce the output voltage 123 (a.k.a., Vout).

Further in this example embodiment, note that the drain node (D) of switch QA1 is connected to receive input voltage V1 provided by voltage source 120-1. The source node (S) of switch QA1 is coupled to the drain node (D) of switch QB1 as well as the input node of inductive path 1231. The source node of switch QB1 is coupled to ground reference voltage. The output node of the inductive path 1231 is coupled to the load 118.

Yet further in this example embodiment, the drain node of switch QA2 of phase 222 is connected to receive input voltage V1 provided by voltage source 120-1. The source node (S) of switch QA2 is coupled to the drain node (D) of switch QB2 as well as the input node of inductive path 1232. The source node of switch QB2 is coupled to ground. The output node of the inductive path 1232 is coupled to the load 118.

As previously discussed, the combination of the phases 221 and 222 produces the output voltage 123 that powers load 118. That is, the inductive path 1231 (electrically conductive path 131) produces output voltage 123; inductive path 1232 (electrically conductive path 132) produces the output voltage 123.

During operation, as shown, controller 1240 produces control signals 105 (such as control signal A1 and control signal B1) to control states of respective switches QA1 and QB1. For example, the control signal A1 produced by the controller 1240 drives and controls the gate node of switch QA1; the control signal B1 produced by the controller 1240 drives and controls the gate node of switch QB1.

Additionally, controller 1240 produces control signals A2 and B2 to control states of switches QA2 and QB2. For example, the control signal A2 produced by the controller 1240 drives and controls the gate node of switch QA2; the control signal B2 produced by the controller 1240 drives and controls the gate node of switch QB2.

In one embodiment, the controller 1240 controls the phases 221 and 222 to be 180 degrees out of phase with respect to each other.

As is known with buck converters, in phase 221, activation of the high-side switch QA1 to an ON state while switch QB1 is deactivated (OFF) couples the input voltage V1 to the input of the inductive path 1231, causing an increase in amount of current provided by the inductive path 1231 to the load 118. Conversely, activation of the low-side switch QB1 to an ON state while switch QA1 is deactivated (OFF) couples the ground reference voltage to the input of the inductive path 1231, causing a decrease in amount of current provided by the inductive path 1231 to the load 118. The controller 1240 monitors a magnitude of the output voltage 123 and controls switches QA1 and QB1 such that the output voltage 123 stays within a desired voltage range.

In phase 222, in a similar manner, activation of the high-side switch QA2 to an ON state while switch QB2 is deactivated (OFF) couples the input voltage V1 to the input of the inductive path 1232 causing an increase in amount of current provided by the inductive path 1232 to the load 118. Conversely, activation of the low-side switch QB2 to an ON state while switch QA2 is deactivated (OFF) couples the ground reference voltage to the input of the inductive path 1232, causing a decrease in amount of current provided by the inductive path 1232 to the load 118. As previously discussed, the controller 1240 monitors a magnitude of the output voltage 123 and controls switches QA2 and QB2 such that the output voltage 123 stays within a desired voltage range.

Thus, in accordance with one embodiment, the inductor device is part of a power converter 1200 that powers a respective load 118.

Figure 7:
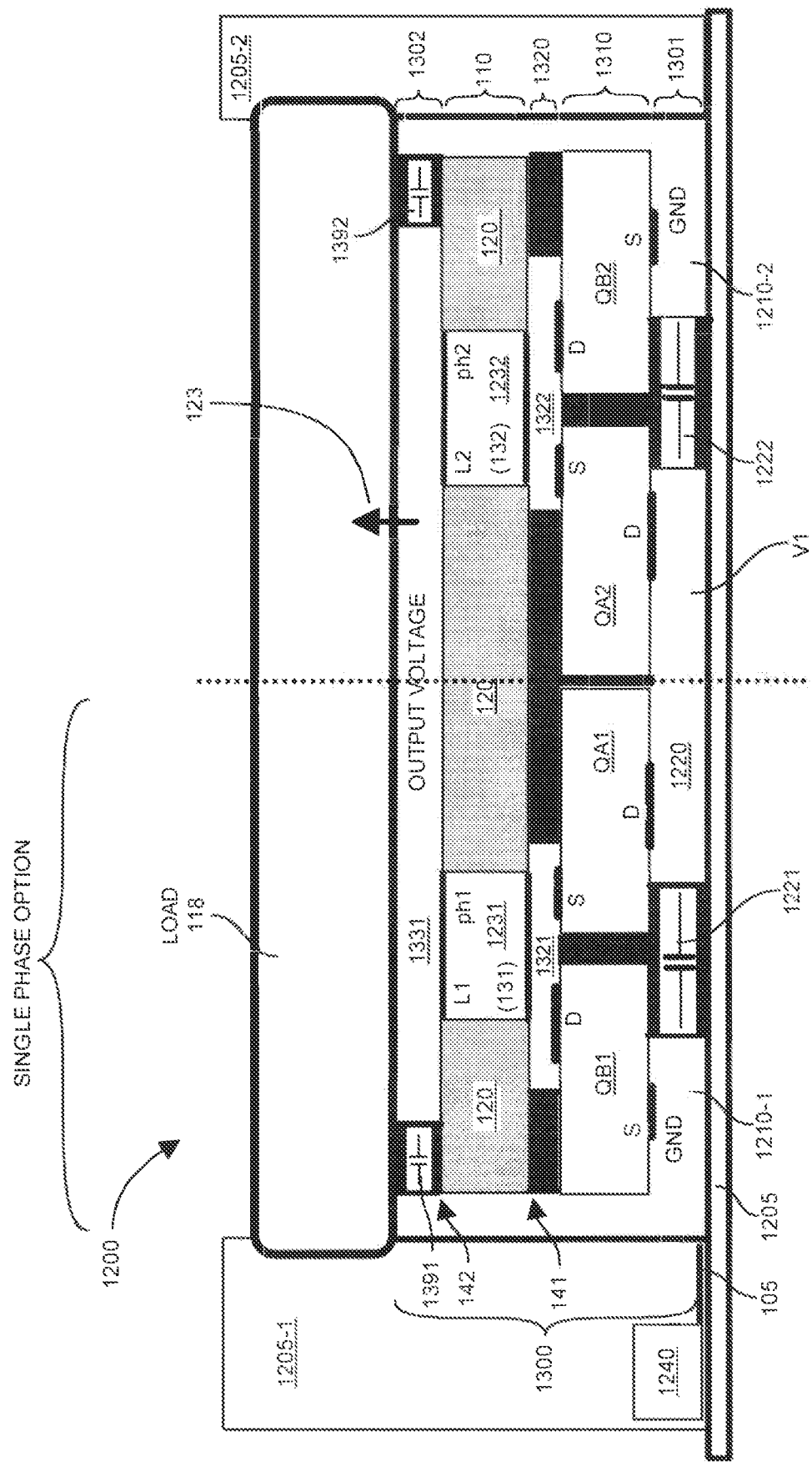
FIG. 7 is an example side view diagram illustrating the power supply in FIG. 6 supporting vertical power flow according to embodiments herein.

FIG. 7 is an example side view diagram illustrating the multi-phase power supply of FIG. 6 instantiated in a vertical circuit stack according to embodiments herein.

As shown in this example embodiment, the power supply 1200 supports vertical power flow.

For example, the substrate 1205 and corresponding one or more power sources such as V1 supply power to the power supply stack assembly 1300, which in turn powers the dynamic load 118. Ground reference (GND) conveyed through the power supply stack assembly 1300 provides a reference voltage and return path for current conveyed through the stack to the load 118.

In one embodiment, the substrate 1205 is a circuit board (such as a standalone board, mother board, standalone board destined to be coupled to a mother board, etc.). The power supply stack assembly 1300 including one or more inductor devices is coupled to the substrate 1205. As previously discussed, the load 118 can be any suitable circuit such as CPUs, GPUs and ASICs (such those including one or more Artificial Intelligence Accelerators), which can be located on standalone circuit board. In one embodiment, the stack assembly 1300 is embedded into a substrate as a module.

Note that the inductor device 110 in the power supply stack assembly 1300 can be instantiated in any suitable manner as described herein. In this non-limiting example embodiment, the power supply stack assembly 1300 includes the inductor device 110 in FIG. 1A or inductor device of any other drawing as described herein. Power supply stack assembly 1300 can be configured to include any of the inductor devices 110 as described herein.

Further in this example embodiment, the fabricator 140 fabricates power supply stack assembly 1300 (such as a DC-DC power converter 165) via stacking of multiple components including a first power interface 1301, one or more switches in switch layer 1310, connectivity layer 1320, one or more inductor assemblies (such as including inductor device 110), and a second power interface 1302.

The fabricator 140 further disposes the first power interface 1301 at a base of the stack (power supply assembly 1300 of components). The base of power supply stack assembly 1300 (such as power interface 1301) couples the power supply stack assembly 1300 to the substrate 1205.

In one embodiment, fabricator 140 disposes capacitors 1221 and 1222 in a layer of the power supply stack assembly 1300 including the power interface 1301.

Yet further, when fabricating the power supply stack assembly 1300, the fabricator 140 electrically couples multiple switches such as switch QA1, QB1, QA2, and QB2 in the power supply stack assembly 1300 to the first power interface 1301. The first power interface 1301 and corresponding connectivity to the substrate 1205 enables the switches QA1, QB1, QA2, and QB2 to receive power such as power input such as input voltage V1 and GND reference voltage from the substrate 1205. One or more traces, power layers, etc., on substrate 1205 provides or conveys the voltages from voltage (or power) sources to the power interface 1301 of the power supply stack assembly 1300.

As previously discussed, controller 1240 generates control signals 105 to control respective switches QA1, QB1, QA2, and QB2 in the power supply stack assembly 1300. Fabricator 140 provides connectivity between the controller 1240 and the switches QA1, QB1, QA2, and QB2 in any suitable manner to convey respective signals 105.

Atop the switches in the switch layer 1310, the fabricator 140 further fabricates the power supply stack assembly 1300 to include one or more inductor devices as described herein. Additionally, via connectivity layer 1320, the fabricator 140 further connects the switches QA1, QB1, QA2, and QB2 to the one or more inductor devices 110.

More specifically, in this example embodiment, the fabricator 140 connects the source node (S) of switch QB1 to the ground reference node 1210-1 in the power interface 1301. Note that the ground reference node 1210-1 extends from the substrate 1205 to the dynamic load 118 via L-shaped ground node 1210-1 (which is connected to the ground voltage reference). The fabricator 140 connects the drain node (D) of switch QB1 to node 1321 (such as fabricated from metal), which is electrically connected to the first end 141 of the inductive path 1231 (such as instantiation of electrically conductive path 131). Thus, via connectivity layer 1320, the fabricator connects the drain node of the switch QB1 to the inductive path 1231 of inductor device 110.

The fabricator 140 connects the drain node (D) of switch QA1 to the voltage source node 1220 (which is electrically connected to the input voltage V1) of the first power interface 1301. The fabricator 140 connects the source node (S) of switch QA1 to node 1321, which is electrically connected to the first end 141 of the inductive path 1231 (instantiation of electrically conductive path 131) as previously discussed. Thus, via connectivity layer 1320 and corresponding node 1321, the source node of the switch QA1 is connected to the inductive path 1231 of inductor device 110.

As further shown, the fabricator 140 connects the source node (S) of switch QB2 to the ground reference node 1210-2 in the power interface 1301. The ground reference node 1210-2 extends from the substrate 1205 to the dynamic load 118 via L-shaped ground reference node 1210-2 (which is connected to the ground voltage reference). The fabricator 140 connects the drain node (D) of switch QB2 to node 1322 (such as fabricated from metal), which is electrically connected to the first end 141 of the inductive path 1232 (such as instantiation of electrically conductive path 132). Thus, via connectivity layer 1320, the drain node of the switch QB2 is connected to the inductive path 1232 of inductor device 110.

Note that although each of the nodes 1210-1 and 1210-2 appear to be L-shaped from a side view of the power supply stack assembly 1300, in one embodiment, the node 1210 extends circumferentially about an outer surface of the power supply stack assembly 1300 (in a similar manner as electrically conductive path 133 as previously discussed).

As further shown, the fabricator 140 connects the drain node (D) of switch QA2 to the voltage source node 1220 (which is connected to voltage V1) in the power interface 1301. The fabricator 140 connects the source node (S) of switch QA2 to node 1322, which is electrically connected to the first axial end 141 of the inductive path 1232 (instantiation of electrically conductive path 132). Thus, via connectivity layer 1320 and corresponding node 1322, the source node of the switch QA2 is connected to the inductive path 1232 of inductor device 110.

Accordingly, the fabricator 140 disposes the one or more switches (such as QA1, QB1, QA2, and QB2) in the power supply stack assembly 1300 between the first power interface 1301 and the inductor device 110.

In one non-limiting example embodiment, each of the one or more switches QA1, QB1, QA2, and QB2 in the power supply stack assembly 1300 is a vertical field effect transistor disposed between the first power interface 1301 and the inductor device 110. However, additionally, or alternatively, note that one or more of switches QA1, QB1, QA2, and QB2 can be any suitable type of switches such as vertical or lateral field effect transistors, bipolar junction transistors, etc. It is also possible for lateral FETs, but vertical FETs are the ideal choice for this concept due to their natural vertical current flow properties which matches the in-line system needs.

As previously discussed, the fabricator 140 fabricates the power supply stack assembly 1300 to include one or more inductor devices 110. In this example embodiment, the fabricator disposes the multiple inductive paths 1231 in the power supply stack assembly 1300 between the multiple switches QA1, QB1, QA2, and QB2 and the second power interface 1302.

In accordance with further embodiments, note that fabrication of the multiple inductive paths 1231 and 1232 includes: fabricating the multiple inductive paths to include a first inductive path 1231 and a second inductive path 1232 extending through core material 120 of the inductor device 110 between the connectivity layer 1320 and the power interface 1302. In one embodiment, fabricator 140 fabricates the inductor device 110 to include: i) core material 120, the core material being magnetically permeable ferromagnetic material, ii) a first inductive path 1231 extending through the core material 120 from a first axial end 141 of the inductor device 110 to a second axial end 142 of the inductor device 110, iii) a second inductive path 1232 extending through the core material 120 from a first axial end 141 of the inductor device 110 to a second axial end 142 of the inductor device 110.

Yet further in this example embodiment, the first inductive path 1231 is disposed in a first phase 221 (FIG. 6) of the power supply stack assembly 1300 (power converter circuit); the second inductive path 1232 is disposed in a second phase 222 (FIG. 6) of the power supply stack assembly 1300 (power converter circuit). During operation of the power converter (power supply stack assembly 1300), a combination of the first phase 221 and the second phase 222 disposed in parallel produce the output voltage 123. If desired, the controller 1240 can be fabricated into the power supply stack assembly 1300 as well or can be integrated into the CPU, GPU or ASIC.

In one embodiment, each of the one or more inductive paths 1231 and 1232 is a respective non-winding path extending from a first layer (such as switch layer 1310) in the stack including the multiple switches QA1, QB1, QA2, and QB2 to a second layer in the stack including the second power interface 1302.

Note that further embodiments herein include connecting multiple inductive paths in the inductor device 110 in parallel to decrease the effective system inductance of a respective voltage regulator. As described herein, any number of inductive paths in the inductor device 110 can be connected in parallel to provide a desired overall system inductance. Thus, in addition to controlling parameters such as permeability of the core material 120, a respective length (between first end 141 and second end 142) of each non-winding electrically conductive path (such as straight or direct path) in the inductor device 110, embodiments herein also include connecting multiple inductive paths in parallel to control a magnitude of inductance provided by the respective inductor device 110. Also note that the parallel inductors may not have the same effective inductance and can be used to optimize the overall system transient or efficiency performance. Embodiments herein include the flexibility of varying inductance values of individual phases such that the overall system inductance can be optimized for different output loads. For example, a high inductance can be implemented for light load, low inductance for heavy load and transients.

As further shown, the fabricator 140 disposes the inductor device 110 in the power supply stack assembly 1200 between the multiple switches (QA1, QB1, QA2, and QB2) in switch layer 1310 and the second power interface 1302.

More specifically, the fabricator 140 produces the power supply assembly 1300 to include a second power interface 1302. In one embodiment, the fabricator 140 connects the output axial end of the inductor device 110 and corresponding nodes to the second power interface 1302. The second power interface 1302 is operable to receive the output voltage 123 produced by the inductor device 110 and output it to the load 118. The fabricator 140 couples the output nodes of both the inductive path 1231 and inductive path 1232 to the output voltage node 1331 (such as a layer of material such as metal). Thus, the output voltage node 1331 is electrically connected to the output of the respective inductive paths 1231 and 1232.

In one embodiment, one or more nodes or pins, pads, etc., of the dynamic load 118 are coupled to the output voltage node 1331. For example, output voltage node 1331 of the power supply stack assembly 1200 conveys the output voltage 123 produced by each of the inductive paths 1231 and 1232 to the one or more nodes, pins, pads, etc., of the load 118.

Accordingly, via switching of the inductive paths between the ground voltage and the input voltage V1, the combination of inductive paths 1231 and 1232 collectively produces the output voltage 123 to power the load 118.

As previously discussed, power supply stack assembly 1300 further includes ground node 1210-1 and 1210-2 (such as an instantiation of third electrically conductive path 133). In one embodiment, the instantiation of electrically conductive path 133 (such as ground nodes 1210-1, 1210-2, etc.,) of the inductor device 110 provide perimeter electromagnetic shielding with respect to power supply stack assembly 1300, preventing or reducing corresponding radiated emissions into the surrounding environment.

In yet further embodiments, the fabricator 140 fabricates the first power interface 1301 to include first contact elements operable to connect the first power interface 1301 at the base of the power supply stack assembly 1300 to a host substrate 1205. The fabricator fabricates the second power interface 1302 to include second contact elements operable to affix a dynamic load 118 to the power supply stack assembly 1300.

Note that power supply stack assembly 1200 is fabricated to further include first capacitors 1221, 1222, etc., providing connectivity between the input voltage node 1220 (first electrically conductive path supplying input voltage V1 to the power supply stack assembly 1300) and ground nodes 1210-1 and 1210-2 (such as second electrically conductive path supplying the ground reference voltage to the power supply stack assembly 1300).

The fabricator 140 further disposes output voltage node 1331 (such as another electrically conductive path) in the layer of the power supply stack assembly 1302 including the second power interface 1302. As previously discussed, the output voltage node 1331 (such as layer of metal) is operable to convey the output voltage 123 to the dynamic load 118.

In accordance with further embodiments, the fabricator 140 fabricates the power supply stack assembly 1300 to include second capacitors (1391, 1392, etc.) connected between the output voltage node 1331 and a respective ground node 1210. More specifically, capacitor 1391 is coupled between output voltage node 1331 and the ground node 1210-1; capacitor 1392 is coupled between output voltage node 1331 and the ground node 1210-2.

As previously discussed, node 1210 can be a continuous perimeter shield surrounding the inductor device 110 and/or power supply stack assembly 1300.

Further embodiments herein include affixing a dynamic load 118 to the second power interface 1302. Accordingly, the dynamic load 118 is affixed atop the power supply stack assembly 1300.

The power supply stack assembly 1300 (assembly of components such as a vertical stack) as described herein provides advantages over conventional power converters. For example, the power supply stack assembly 1300 as described herein provides novel connectivity of components in an assembly (such as via stacking), resulting in shorter circuit paths and lower losses when converting and delivering power to the dynamic load 118.

As previously discussed with respect to FIG. 6, during operation, the inductor device 110 and corresponding inductive paths 1231 and 1232 are operable to produce an output voltage 123 based on the received power (current supplied by input voltage, V1). In other words, the power supply stack assembly 1300 and corresponding fabricated stack of components (such as first power interface 1301, one or more switches QA1, QB1, QA2, and QB2, inductor device 110, second power interface 1302) is a power converter operable to convert an input voltage V1 (such as a DC voltage) received at the first power interface 1301 into the output voltage 123 (such as a DC voltage) outputted from the second power interface 1302 to the dynamic load 118.

Further embodiments herein include fabrication of the system. For example, embodiments herein include a fabricator 140. The fabricator 140 receives a substrate 1205 such as a circuit board; the fabricator 140 affixes a base (such as interface 1301) of the stack of components (such as a power supply stack assembly 1300) to the circuit board. As previously discussed, the stack of components (power supply stack assembly 1300) is operative to generate an output voltage 123 to power a load 118. The load 118 is either affixed to the circuit board or the load 118 is affixed atop the power supply stack assembly 1300.

Further, as previously discussed, the load 118 can be any suitable circuit such as CPUs, GPUs and ASICs (such those including one or more Artificial Intelligence Accelerators), which can be located on standalone circuit board.

Thus, in one embodiment, the (circuit, system, etc.) fabricator 140 receives a substrate 1205 (such as a circuit board). The circuit fabricator receives the inductor device 110 (a first circuit component) as previously discussed. The circuit fabricator affixes the first circuit component (inductor device 110 or component carrying the inductor device 110) to the substrate 1205. The circuit board fabricator receives a second circuit component (such as a load 118). The circuit board fabricator affixes the second circuit component (load 118) to the first circuit component (inductor device 110). During power converter operation, a power supply controller 1240 disposed on the circuit board controls conveyance of current through the inductor device 110 (such as electrically conductive paths 131 and 132 or any number of electrically conductive paths) from one or more voltage sources (such as providing input voltage V1) to produce an output voltage 123 (Vout) that powers the load 118 (second circuit component).

Note that, in one embodiment, the substrate 1205 includes optional substrate portions 1205-1 and 1205-2 in which case the power supply assembly 1200 is embedded in the substrate 1205. Even if embedded into a cavity formed by the substrate 1205, substrate portion 1205-1, and substrate portion 1205-2, the power supply assembly 1205 is still affixed to the substrate 1205.

Figure 8:
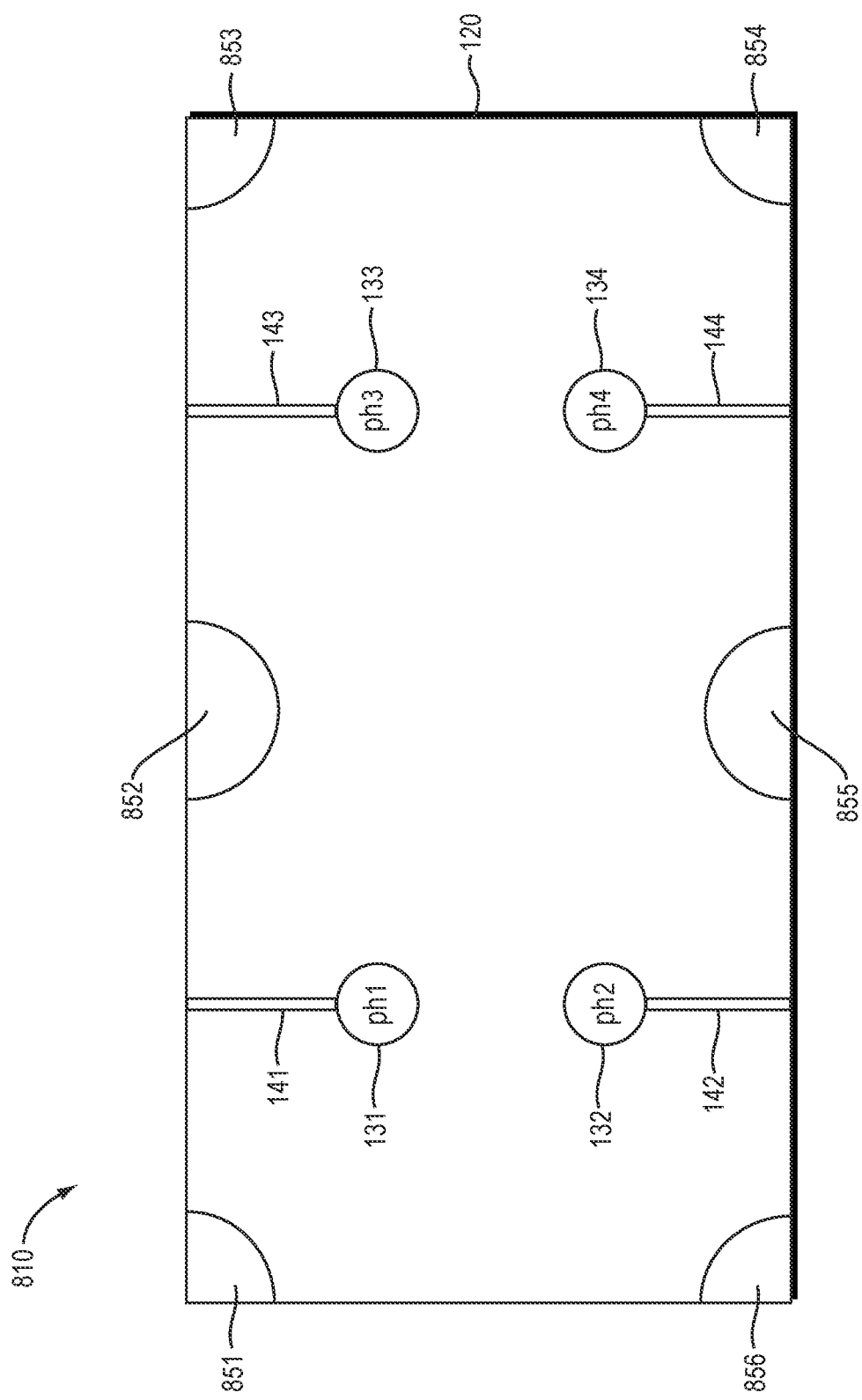
FIG. 8 is an example diagram illustrating of a cross-sectional view of an inductor device according to embodiments herein.

FIG. 8 is an example diagram illustrating of a cross-sectional view (bottom looking up) of an inductor device according to embodiments herein.

In this example embodiment, the fabricator 140 (assembler) fabricates the inductor device 810 (a.k.a., inductor assembly) to include pairs of electrically conductive paths (inductive paths).

For example, in one embodiment, the fabricator 140 fabricates a first pair of electrically conductive paths (such as first electrically conductive path 131 and second electrically conductive path 132) in the core material 120 in a manner as previously discussed. As shown, the second electrically conductive path 132 (inductor, or so-called phase ph2) is spaced apart from the first electrically conductive path 131 (inductor, or so-called phase ph1). Each of the electrically conductive paths 131 and 132 in the first pair extend from the proximal end 111 to the distal end 112 of the inductor device 810.

Gap 141 provides beneficial tuning associated with the first inductive path (electrically conductive path 131); gap 142 provides beneficial tuning associated with the second inductive path (electrically conductive path 132).

Additionally, the fabricator fabricates a second pair of electrically conductive paths (electrically conductive path 133 and electrically conductive path 134) in the core material 120. Each of the electrically conductive paths 133 and 134 (similar to that as previously discussed for electrically conductive paths 131 and 132) in the second pair extends from the proximal end 111 to the distal end 112. The second pair of electrically conductive paths includes a third electrically conductive path 133 (inductor, phase ph3) and a fourth electrically conductive path 134 (inductor, phase ph4). The fourth electrically conductive path 134 is spaced apart from the third electrically conductive path 133.

As further shown, the fabricator produces the inductor device 810 to include a gap for each electrically conductive path. For example, electrically conductive path 131 includes gap 141; electrically conductive path 132 includes gap 142; electrically conductive path 133 includes gap 143; electrically conductive path 134 includes gap 144.

The inductor device 810 further includes any number of electrically conductive return paths at a periphery of each pair of electrically conductive paths. For example, electrically conductive path 851, 852, 855, and 856 are disposed about a periphery of the first pair of electrically conductive paths 131 and 132; electrically conductive path 852, 853, 854, and 855 are disposed about a periphery of the second pair of electrically conductive paths 133 and 134. Each of the electrically conductive paths 851, 852, 853, 854, 855, and 856 extends from the proximal end 111 of the inductor device 810 to the distal end 112 in a similar manner as previously discussed for inductor device 110.

Figure 9:
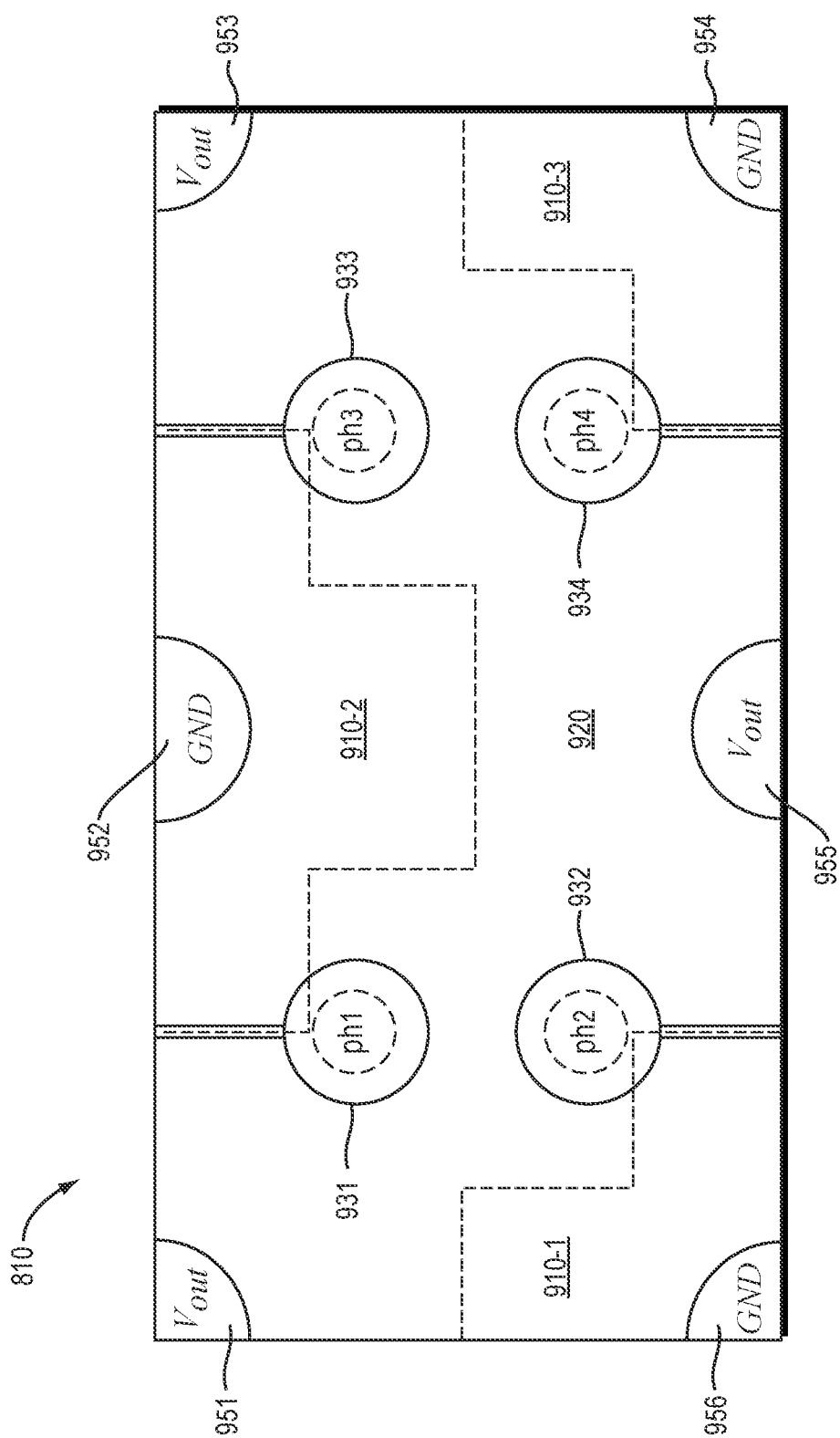
FIG. 9 is an example diagram illustrating a view of pads of an inductor device according to embodiments herein.

FIG. 9 is an example diagram illustrating a see-through view (such as a top view looking down) of pads of an inductor device according to embodiments herein.

As shown in this example embodiment, with reference to both FIGS. 8 and 9, fabricator 140 produces the inductor device 810 to include multiple conductive pads (fabricated from metal, metal alloy, etc.) at the proximal end 111 to facilitate connectivity of the inductor device 110 to a respective circuit.

More specifically, in this example embodiment, the fabricator 140 couples/connects the conductive pad 951 (such as a Vout pad) to the proximal end 111 of the electrically conductive path 851. The fabricator 140 couples/connects the conductive pad 952 (such as a ground pad) to the proximal end 111 of the electrically conductive path 852. The fabricator 140 couples/connects the conductive pad 953 (such as a Vout pad) to the proximal end 111 of the electrically conductive path 853.

As further shown, the fabricator 140 couples/connects the conductive pad 954 (such as a ground pad) to the proximal end 111 of the electrically conductive path 854. The fabricator 140 couples/connects the conductive pad 955 (such as a Vout pad) to the proximal end 111 of the electrically conductive path 855. The fabricator 140 couples/connects the conductive pad 956 (such as a ground pad) to the proximal end 111 of the electrically conductive path 856.

The fabricator 140 couples a distal end 112 of the electrically conductive path 856 to the conductive pad 910-1 (ground); the fabricator 140 couples a distal end 112 of the electrically conductive path 852 to the conductive pad 910-2

(ground); the fabricator 140 couples a distal end 112 of the electrically conductive path 854 to the conductive pad 910-3 (ground).

The fabricator 140 further couples a distal end 112 of the electrically conductive path 851 to the conductive pad 920 (Vout); the fabricator 140 couples a distal end 112 of the electrically conductive path 855 to the conductive pad 920 (Vout); the fabricator 140 couples a distal end 112 of the electrically conductive path 853 to the conductive pad 920 (Vout).

Figure 10:
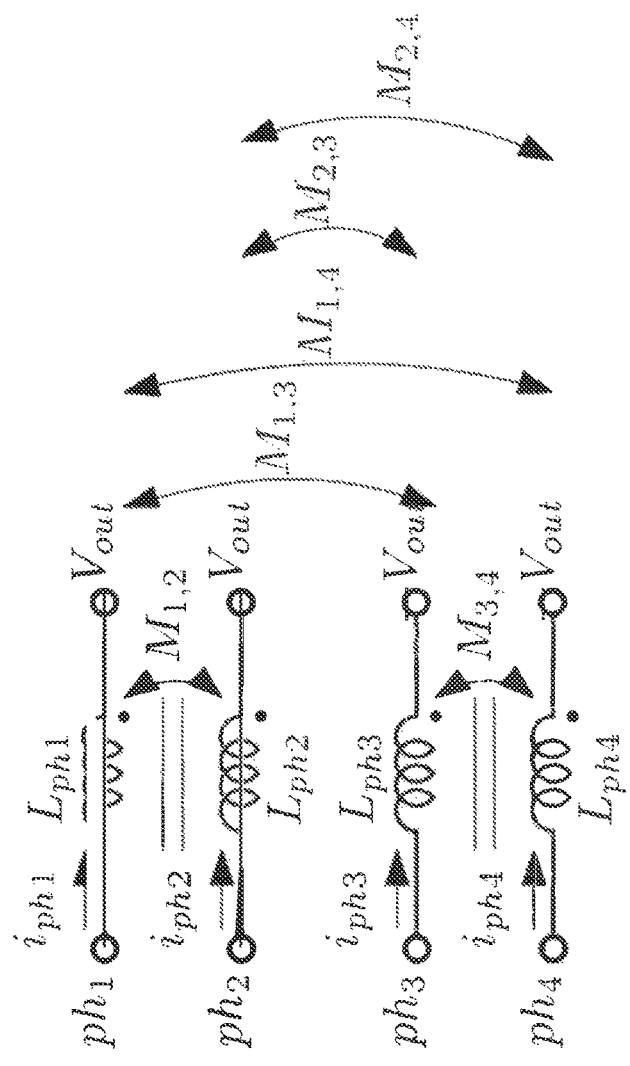
FIG. 10 is an example diagram illustrating magnetic coupling attributes of an inductor device according to embodiments herein.

FIG. 10 is an example diagram illustrating attributes (such as a degree of magnetic coupling associated with an array of a single primitive with N_x=1 and N_y=2 electric circuit) associated with the corresponding electrically conductive paths (inductors) in the inductor device 810 according to embodiments herein.

FIG. 11A is an example diagram illustrating a cross-sectional view (from bottom looking up) of an inductor device according to embodiments herein.

In this example embodiment, the fabricator 140 (assembler) fabricates the inductor device 1110 (a.k.a., inductor assembly) to include pairs of electrically conductive paths (inductive paths).

For example, in one embodiment, the fabricator 140 fabricates the inductor device 1110 to include a sequence of multiple pairs of inductive paths.

For example, the fabricator 140 fabricates a first pair of electrically conductive paths (such as first electrically conductive path 131 and second electrically conductive path 132) in the core material 120 in a manner as previously discussed. As shown, the second electrically conductive path 132 (inductor, phase ph2) is spaced apart from the first electrically conductive path 131 (inductor, phase ph1). Each of the electrically conductive paths 131 and 132 in the first pair extend from the proximal end 111 to the distal end 112 of the inductor device 1110. Gap 141 provides beneficial tuning associated with the first inductive path (electrically conductive path 131); gap 142 provides beneficial tuning associated with the second inductive path (electrically conductive path 132).

Additionally, the fabricator fabricates a second pair of electrically conductive paths (electrically conductive path 133 and electrically conductive path 134) in the core material 120. Each of the electrically conductive paths 133 and 134 (similar to that as previously discussed for electrically conductive paths 131 and 132) in the second pair extends from the proximal end 111 to the distal end 112. The second pair of electrically conductive paths includes a third electrically conductive path 133 (inductor, phase ph3) and a fourth electrically conductive path 134 (inductor, phase ph4). The fourth electrically conductive path 134 is spaced apart from the third electrically conductive path 133. The fabricator produces the inductor device 1110 to include a gap for each electrically conductive path. Gap 143 provides beneficial tuning associated with the inductive path (electrically conductive path 133); gap 144 provides beneficial tuning associated with the inductive path (electrically conductive path 134).

Additionally, the fabricator fabricates a third pair of electrically conductive paths (electrically conductive path 135 and electrically conductive path 136) in the core material 120. Each of the electrically conductive paths 135 and 136 (similar to that as previously discussed for electrically conductive paths 131 and 132) in the third pair extends at least from the proximal end 111 to the distal end 112. The third pair of electrically conductive paths includes electrically conductive path 135 (inductor, phase ph5) and electrically conductive path 136 (inductor, phase ph6). The electrically conductive path 135 is spaced apart from the electrically conductive path 136 in a similar manner as previously discussed. The fabricator produces the inductor device 1110 to include a gap for each electrically conductive path. Gap 145 provides beneficial tuning associated with the inductive path (electrically conductive path 135); gap 146 provides beneficial tuning associated with the inductive path (electrically conductive path 136).

Additionally, the fabricator fabricates a fourth pair of electrically conductive paths (electrically conductive path 137 and electrically conductive path 138 in the core material 120. Each of the electrically conductive paths 137 and 138 (similar to that as previously discussed for electrically conductive paths 131 and 132) in the third pair extends from the proximal end 111 to the distal end 112. The third pair of electrically conductive paths includes electrically conductive path 137 (inductor, phase ph7) and electrically conductive path 138 (inductor, phase ph8). The electrically conductive path 137 is spaced apart from the electrically conductive path 138 in a similar manner as previously discussed. The fabricator produces the inductor device 1110 to include a gap for each electrically conductive path. Gap 147 provides beneficial tuning associated with the inductive path (electrically conductive path 137); gap 148 provides beneficial tuning associated with the inductive path (electrically conductive path 138).

As further shown, the inductor device 1110 includes any number of electrically conductive return paths at a periphery of each pair of electrically conductive paths. For example, electrically conductive path 851, 852, 855, and 856 are disposed about the first pair of electrically conductive paths 131 and 132; electrically conductive path 852, 853, 854, and 855 are disposed about the second pair of electrically conductive paths 133 and 134; electrically conductive path 853, 857, 859, and 854 are disposed about the third pair of electrically conductive paths 135 and 136; electrically conductive path 857, 858, 860, and 859 are disposed about the fourth pair of electrically conductive paths 137 and 138.

Each of the electrically conductive paths 851, 852, 853, 854, 855, 856, 857, 858, 859, and 860 extends from the proximal end 111 of the inductor device 1110 to the distal end 112 in a similar manner as previously discussed for inductor device 110.

FIG. 11B is an example diagram illustrating a top view of pads of an inductor device according to embodiments herein.

As shown in this example embodiment, fabricator 140 produces the inductor device 1110 to include multiple conductive pads (fabricated from metal, metal alloy, etc.) at the proximal end 111 to facilitate connectivity of the inductor device 110 to a respective circuit.

More specifically, in this example embodiment, the fabricator 140 couples/connects the conductive pad 951 (such as a Vout pad) to the proximal end 111 of the electrically conductive path 851. The fabricator 140 couples/connects the conductive pad 952 (such as a ground pad) to the proximal end 111 of the electrically conductive path 852. The fabricator 140 couples/connects the conductive pad 953 (such as a Vout pad) to the proximal end 111 of the electrically conductive path 853.

As further shown, the fabricator 140 couples/connects the conductive pad 954 (such as a ground pad) to the proximal end 111 of the electrically conductive path 854. The fabricator 140 couples/connects the conductive pad 955 (such as a Vout pad) to the proximal end 111 of the electrically conductive path 855. The fabricator 140 couples/connects the conductive pad 956 (such as a ground pad) to the proximal end 111 of the electrically conductive path 856.

The fabricator 140 couples/connects the conductive pad 957 (such as a ground pad) to the proximal end 111 of the electrically conductive path 857. The fabricator 140 couples/connects the conductive pad 958 (such as a Vout pad) to the proximal end 111 of the electrically conductive path 858. The fabricator 140 couples/connects the conductive pad 959 to the proximal end 111 of the electrically conductive path 859. The fabricator 140 couples/connects the conductive pad 960 to the proximal end 111 of the electrically conductive path 860.

The fabricator 140 couples a distal end 112 of the electrically conductive path 856 to the conductive pad 910-1 (ground); the fabricator 140 couples a distal end 112 of the electrically conductive path 852 to the conductive pad 910-2 (ground); the fabricator 140 couples a distal end 112 of the electrically conductive path 854 to the conductive pad 910-3 (ground); the fabricator 140 couples a distal end 112 of the electrically conductive path 857 to the conductive pad 910-4 (Ground); the fabricator 140 couples a distal end 112 of the electrically conductive path 860 to the conductive pad 910-5 (ground).

The fabricator 140 further couples a distal end 112 of the electrically conductive path 851 to the conductive pad 920 (Vout); the fabricator 140 couples a distal end 112 of the electrically conductive path 855 to the conductive pad 920 (Vout); the fabricator 140 couples a distal end 112 of the electrically conductive path 853 to the conductive pad 920 (Vout); the fabricator 140 couples a distal end 112 of the electrically conductive path 859 to the conductive pad 920 (Vout); the fabricator 140 couples a distal end 112 of the electrically conductive path 858 to the conductive pad 920 (Vout).

Figures 12A, 12B:
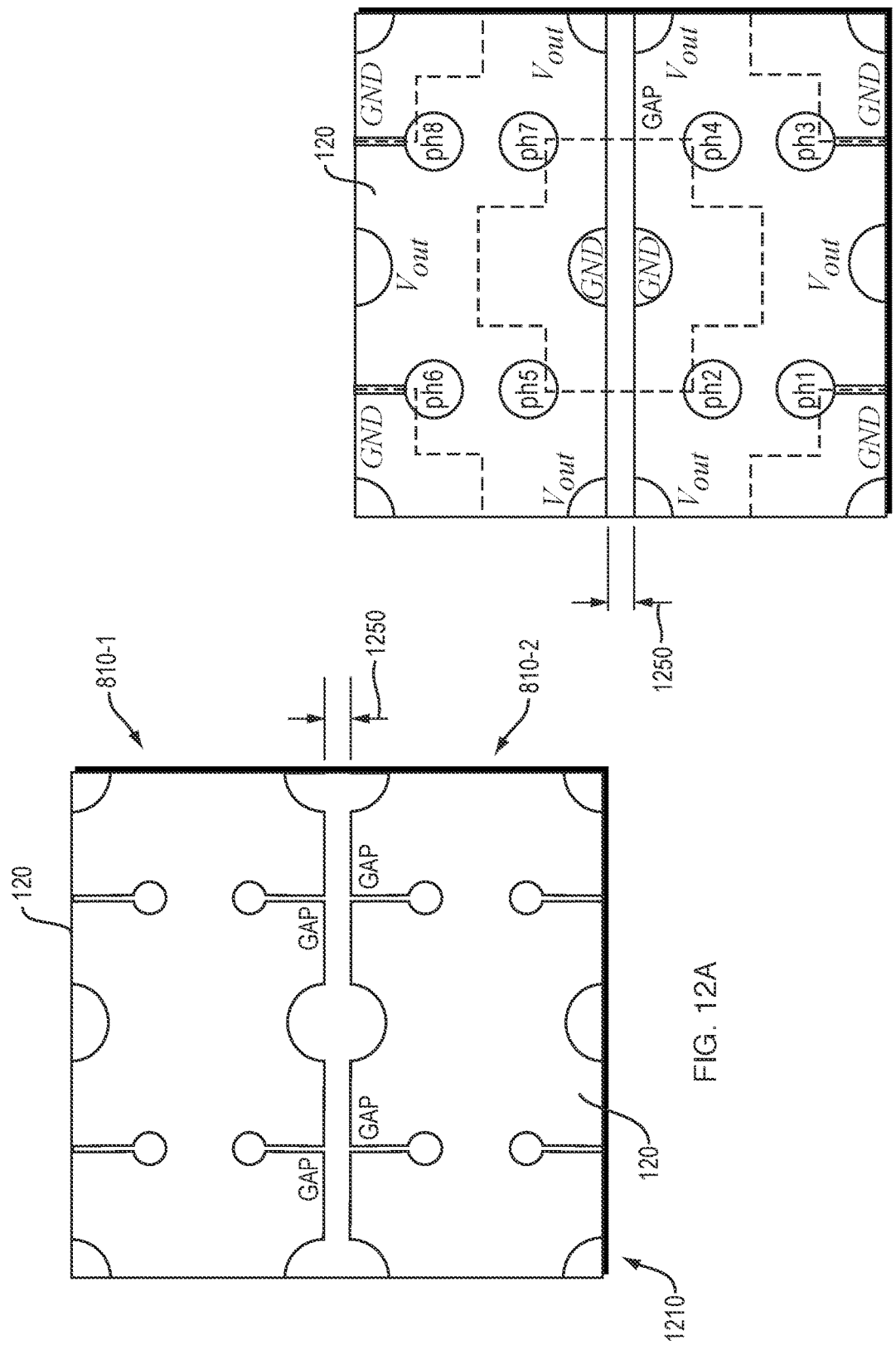
FIG. 12A is an example diagram illustrating of a cross-sectional view of an inductor device according to embodiments herein.
FIG. 12B is an example diagram illustrating a view of pads of an inductor device according to embodiments herein.

FIG. 12A is an example diagram illustrating of a cross-sectional view of an inductor device according to embodiments herein.

In this example embodiment, the fabricator fabricates the inductor device 1210 to include a combination of inductor device 810-1 and inductor device 810-2 disposed in core material 120. Inductor device 810-1 represents a first instance of the inductor device 810 in FIG. 8. Inductor device 810-2 represents a second instance of the inductor device 810 in FIG. 8.

Referring again to FIG. 12A, the inductor device 1210 includes a gap 1250 separating the inductor device 810-1 and inductor device 810-2 associated with inductor device 1210.

In this configuration, the gap 1250 (spacing, void in core material 120) between phases prevents coupling between the electrically conductive paths. In one embodiment, the thickness of gap 1250 (such as filled with air, gas, liquid, solid having a different magnetic permeability than core material 120, etc.) is greater than 2 time the thickness of gaps 141, 142, etc.

FIG. 12B is an example diagram illustrating a view of pads of an inductor device according to embodiments herein.

In this example embodiment, the inductor device 1210 includes conductive pads and disposed at the proximal end 111 and distal end 112 in a similar manner as shown and as previously discussed in FIG. 9.

Figure 13:
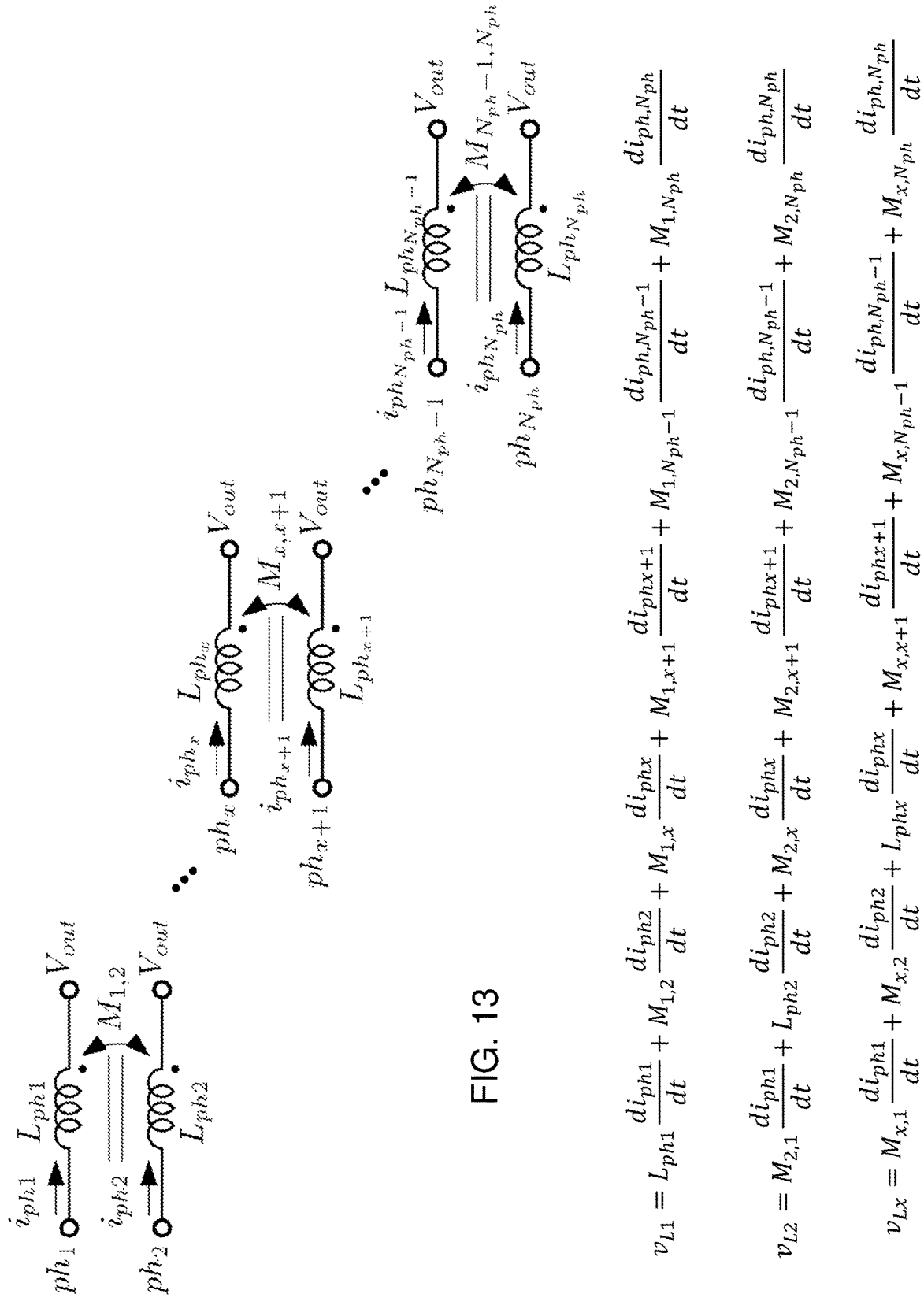
FIG. 13 is an example diagram illustrating magnetic coupling attributes of an inductor device according to embodiments herein.

FIG. 13 is an example diagram illustrating magnetic coupling attributes of an inductor device Array of single primitive (with $N\_x \geq 1$ and $N\_y \geq 1$) including any number of phases according to embodiments herein.

Figure 14A:
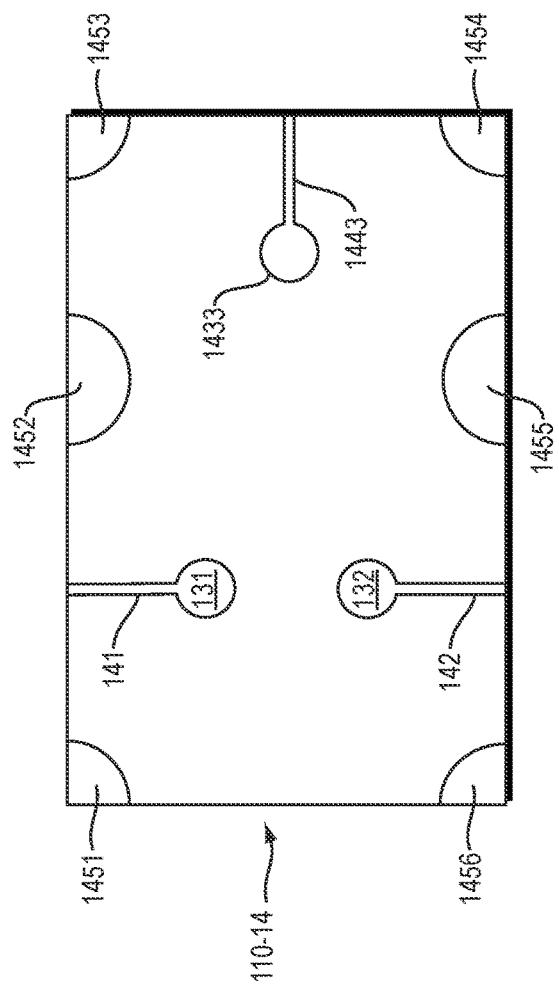
FIG. 14A is an example diagram illustrating of a cross-sectional view of an inductor device according to embodiments herein.

FIG. 14A is an example diagram illustrating a cross-sectional view of an inductor device according to embodiments herein.

In this example embodiment, the fabricator 140 (assembler) fabricates the inductor device 110-14 (a.k.a., inductor assembly, $N\_ph=2*(N\_x)*[(N]\_y)+1)$ to include a pair of electrically conductive paths (inductive paths) and a single electrically conductive path.

For example, in one embodiment, the fabricator 140 fabricates a first pair of electrically conductive paths (such as first electrically conductive path 131 and second electrically conductive path 132) in the core material 120 of inductor device 110-14 in a manner as previously discussed. As shown, the second electrically conductive path 132 (inductor, phase ph2) is spaced apart from the first electrically conductive path 131 (inductor, phase ph1). Each of the electrically conductive paths 131 and 132 in the first pair extend from the proximal end 111 to the distal end 112 of the inductor device 110-14. Gap 141 provides beneficial tuning associated with the first inductive path (electrically conductive path 131); gap 142 provides beneficial tuning associated with the first inductive path (electrically conductive path 132).

Additionally, the fabricator fabricates the inductor device 110-14 to include electrically conductive path 1433 in the core material 120 from the proximal end 111 to the distal end 112. In a similar manner as previously discussed, gap 1443 provides beneficial tuning associated with the first inductive path (electrically conductive path 1433).

As further shown, the inductor device 110-14 includes any number of electrically conductive return paths at a periphery of each pair of electrically conductive paths or each single electrically conductive path.

For example, electrically conductive path 1451, 1452, 1455, and 1456 are disposed about the first pair of electrically conductive paths 131 (inductor, phase ph1) and 132 (inductor, path ph2); electrically conductive paths 1452, 1453, 1454, and 1455 are disposed about the electrically conductive path 1433.

In a similar manner as previously discussed, each of the electrically conductive paths 1451, 1452, 1453, 1454, 1455, and 1456 extends from the proximal end 111 of the inductor device 110-14 to the distal end 112 in a similar manner as previously discussed for inductor device 110.

Figure 14B:
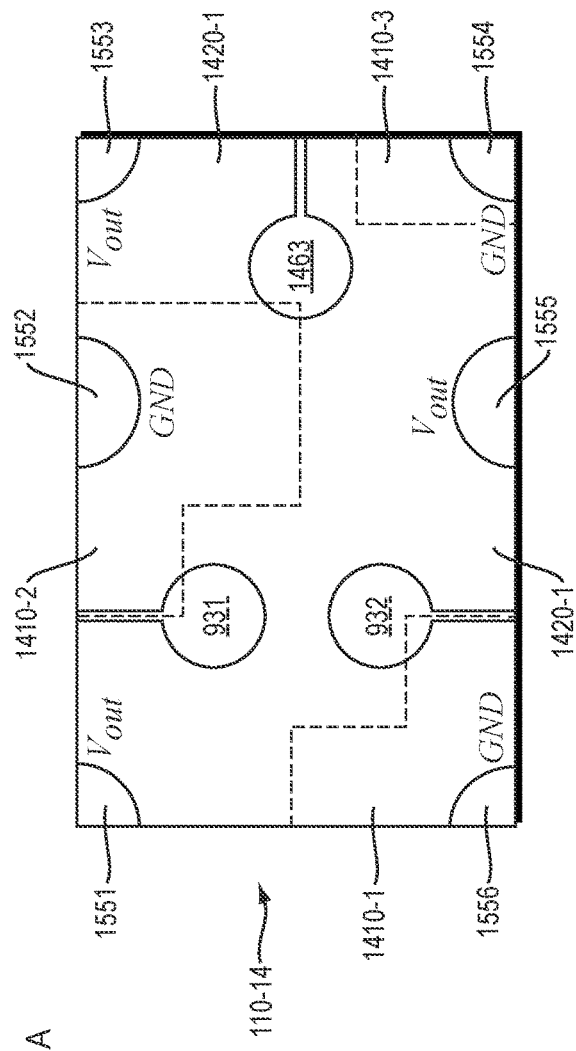
FIG. 14B is an example diagram illustrating a view of pads of an inductor device according to embodiments herein.

FIG. 14B is an example diagram illustrating a view of pads of the inductor device in FIG. 14A according to embodiments herein.

As shown in this example embodiment, fabricator 140 produces the inductor device 1410 to include multiple conductive pads (fabricated from metal, metal alloy, etc.) at the proximal end 111 to facilitate connectivity of the inductor device 110-14 to a respective circuit.

As further shown, the fabricator 140 couples/connects the conductive pad 1551 (such as a Vout pad) to the proximal end 111 of the electrically conductive path 1451.

The fabricator 140 couples/connects the conductive pad 1552 (such as a ground pad) to the proximal end 111 of the electrically conductive path 1452.

The fabricator 140 couples/connects the conductive pad 1553 (such as a Vout pad) to the proximal end 111 of the electrically conductive path 1453.

The fabricator 140 couples/connects the conductive pad 1554 (such as a ground pad) to the proximal end 111 of the electrically conductive path 1454.

The fabricator 140 couples/connects the conductive pad 1555 (such as a Vout pad) to the proximal end 111 of the electrically conductive path 1455.

The fabricator 140 couples/connects the conductive pad 1556 (such as a ground pad) to the proximal end 111 of the electrically conductive path 1456.

The fabricator 140 couples a distal end 112 of the electrically conductive path 1451 to the conductive pad 1420-1 (Vout).

The fabricator 140 couples a distal end 112 of the electrically conductive path 1452 to the conductive pad 1410-2 (ground).

The fabricator 140 couples a distal end 112 of the electrically conductive path 1453 to the conductive pad 1420-1 (Vout).

The fabricator 140 couples a distal end 112 of the electrically conductive path 1454 to the conductive pad 1410-3 (ground).

The fabricator 140 couples a distal end 112 of the electrically conductive path 1455 to the conductive pad 1420-1 (Vout).

The fabricator 140 couples a distal end 112 of the electrically conductive path 1456 to the conductive pad 1410-1 (ground).

Figure 15:
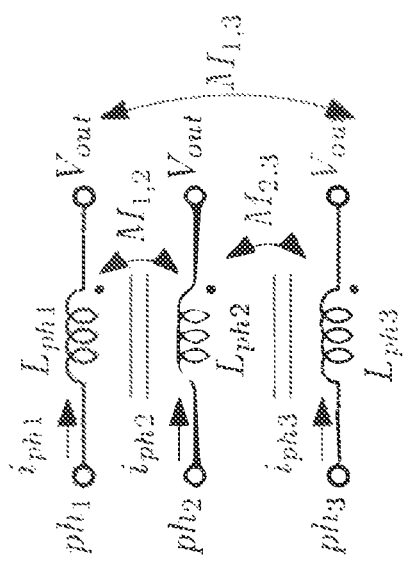
FIG. 15 is an example diagram illustrating magnetic coupling attributes of an inductor device (in FIGS. 14A and 14B) according to embodiments herein.

FIG. 15 is an example diagram illustrating magnetic coupling attributes of the inductor device as described in FIG. 14A according to embodiments herein.

Figure 16:
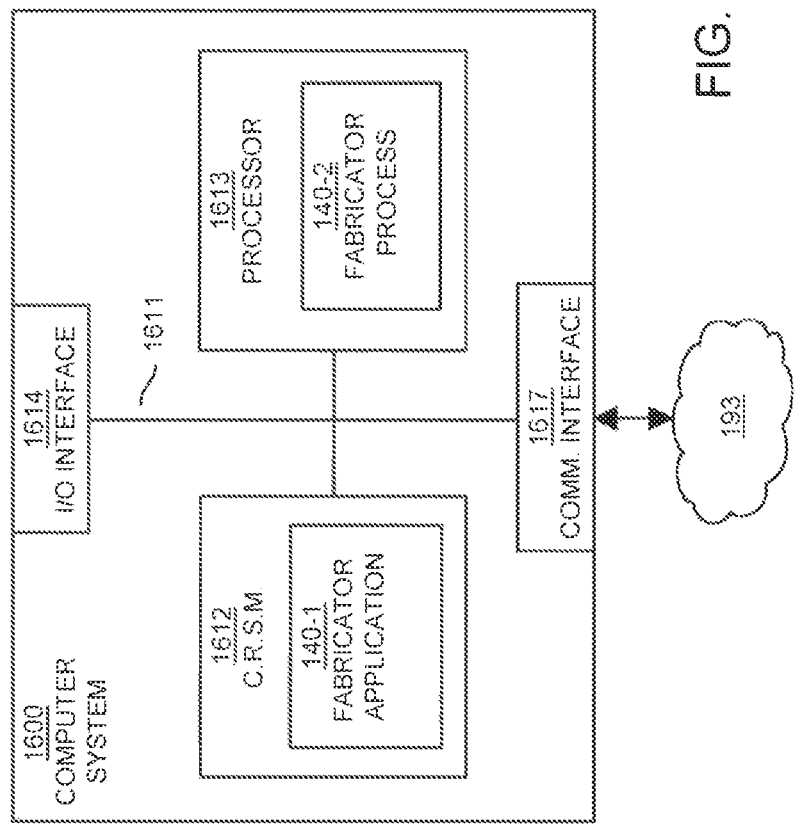
FIG. 16 is an example diagram illustrating example computer architecture (fabricator system, hardware, etc.) operable to execute one or more methods according to embodiments herein.

FIG. 16 is a diagram illustrating example computer architecture operable to execute one or more methods according to embodiments herein.

As previously discussed, any of the resources (such as controller 1240, fabricator 140, etc.) as discussed herein can be configured to include computer processor hardware and/or corresponding executable instructions to carry out the different operations as discussed herein.

As shown, computer system 1600 of the present example includes an interconnect 1611 that couples computer readable storage media (CRSM) 1612 such as a non-transitory type of media (which can be any suitable type of hardware storage medium in which digital information can be stored and retrieved), a processor 1613 (computer processor hardware), I/O interface 1614, and a communications interface 1617.

I/O interface(s) 1614 supports connectivity to external hardware 1699 such as a keyboard, display screen, repository, etc.

Computer readable storage medium 1612 can be any hardware storage device such as memory, optical storage, hard drive, floppy disk, etc. In one embodiment, the computer readable storage medium 1612 stores instructions and/or data.

As shown, computer readable storage media 1612 can be encoded with fabricator application 140-1 (e.g., including instructions) to carry out any of the operations as discussed herein.

During operation of one embodiment, processor 1613 accesses computer readable storage media 1612 via the use of interconnect 1611 in order to launch, run, execute, interpret or otherwise perform the instructions in fabricator application 140-1 stored on computer readable storage medium 1612. Execution of the fabricator application 140-1 produces fabricator process 140-2 to carry out any of the operations and/or processes as discussed herein.

Those skilled in the art will understand that the computer system 1600 can include other processes and/or software and hardware components, such as an operating system that controls allocation and use of hardware resources to execute fabricator application 140-1.

In accordance with different embodiments, note that computer system may reside in any of various types of devices, including, but not limited to, a power supply, switched-capacitor converter, power converter, a mobile computer, a personal computer system, a wireless device, a wireless access point, a base station, phone device, desktop computer, laptop, notebook, netbook computer, mainframe computer system, handheld computer, workstation, network computer, application server, storage device, a consumer electronics device such as a camera, camcorder, set top box, mobile device, video game console, handheld video game device, a peripheral device such as a switch, modem, router, set-top box, content management device, handheld remote control device, any type of computing or electronic device, etc. The computer system 1650 may reside at any location or can be included in any suitable resource in any network environment to implement functionality as discussed herein.

Figure 17:
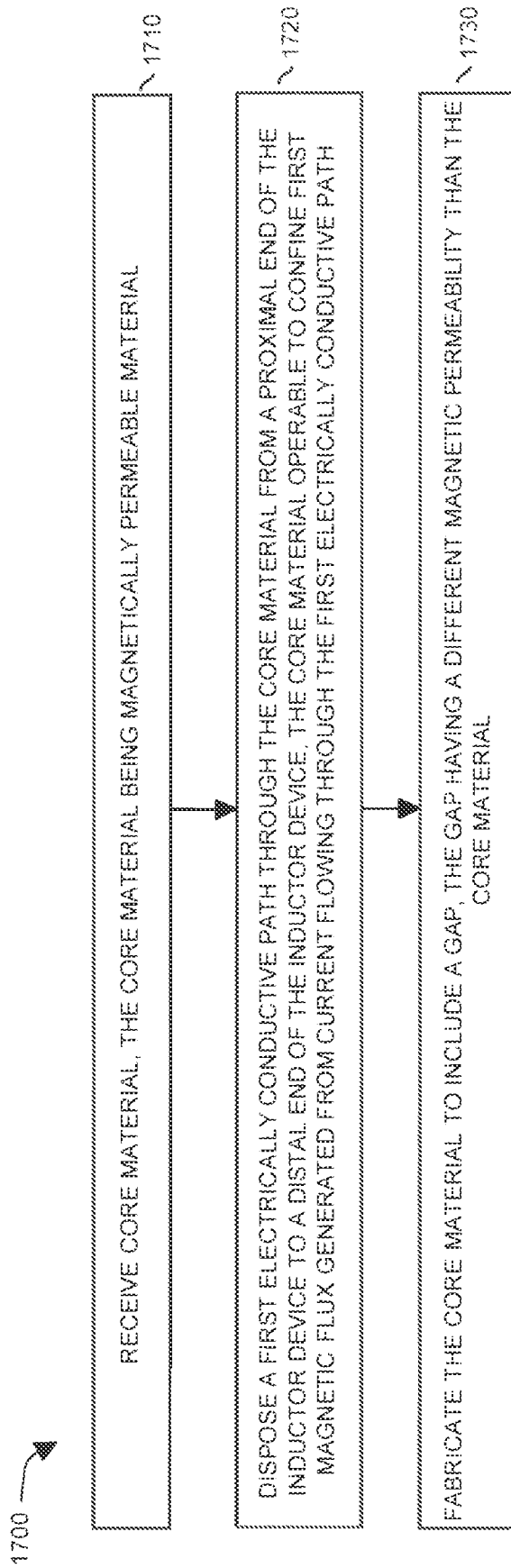
FIG. 17 is an example diagram illustrating a method of fabricating an inductor device according to embodiments herein.

Functionality supported by one or more resources as described herein are discussed via flowchart in FIG. 17. Note that the steps in the flowcharts below can be executed in any suitable order.

FIG. 17 is a flowchart 1700 illustrating an example method according to embodiments herein. Note that there will be some overlap with respect to concepts as discussed above.

In processing operation 1710, the fabricator (assembler) receives a block of core material 120, the core material 120 being magnetically permeable material.

In processing operation 1720, the fabricator disposes a first electrically conductive path 131 through the core material 120 from a proximal end 111 of the inductor device 110 to a distal end 112 of the inductor device 110. The core material 120 confines first magnetic flux generated from current flowing through the first electrically conductive path 131.

In processing operation 1730, the fabricator fabricates the core material 120 to include a gap 141 associated with the first electrically conductive path 131. The gap 141 (such as filled with air, vacuum, other material) has a different magnetic permeability than the core material 120.

Note again that techniques herein are well suited for use in inductor and power converter applications. However, it should be noted that embodiments herein are not limited to use in such applications and that the techniques discussed herein are well suited for other applications as well.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

The invention claimed is:

1. An inductor device having a proximal end and a distal end, the inductor device comprising:
    core material, the core material being magnetically permeable;
    a first electrically conductive path residing in a first void of the core material and extending through the first void of the core material from the proximal end of the inductor device to the distal end of the inductor device, the first electrically conductive path being an only electrically conductive path disposed in the first void, the core material operable to confine first magnetic flux generated from first current flowing through the first electrically conductive path; and a first gap disposed in the core material, the first gap having a different magnetic permeability than the core material.

2. The inductor device as in claim 1, wherein the first gap is void of the core material.

3. The inductor device as in claim 1 further comprising:
a second electrically conductive path extending through the core material from the proximal end of the inductor device to the distal end of the inductor device, the core material operable to confine second magnetic flux generated from second current flowing through the second electrically conductive path; and
wherein the first gap reduces an effective permeability in the core material and modifies an inductance of the inductor device.

4. The inductor device as in claim 3, wherein the second electrically conductive path is spaced apart from the first electrically conductive path; and
wherein the first gap is disposed in the core material other than between the first electrically conductive path and the second electrically conductive path.

5. The inductor device of claim 1 further comprising:
a pair of electrically conductive paths including the first electrically conductive path and a second electrically conductive path; and
a set of electrically conductive paths disposed around a periphery of the pair of electrically conductive paths.

6. The inductor device as in claim 5 further comprising:
a conductor element disposed at the distal end of the inductor device, the conductor element coupling the first electrically conductive path and at least one of the electrically conductive paths in the set at the distal end of the inductor device.

7. The inductor device as in claim 1, further comprising:
a second electrically conductive path extending from the proximal end to the distal end of the inductor device, the second electrically conductive path being a return path operable to convey the first current.

8. The inductor device as in claim 1, wherein the first gap is a first volume extending radially outward from the first electrically conductive path, the first gap extending between the proximal end and the distal end of the inductor device.

9. The inductor device as in claim 1, wherein a thickness of the first gap controls an inductance and saturation associated with the inductor device.

10. The inductor device as in claim 1 further comprising:
a second electrically conductive path extending through the core material from the proximal end of the inductor device to the distal end of the inductor device, the second electrically conductive path disposed adjacent to the first electrically conductive path; and
wherein the first gap is a first air gap associated with the first electrically conductive path, the inductor device further comprising:
a second air gap associated with the second electrically conductive path.

11. The inductor device as in claim 10, wherein the first air gap extends radially outward from the first electrically conductive path in a first direction; and
wherein the second air gap extends radially outward from the second electrically conductive path in a second direction, the first aft gap and the second air gap disposed in the core material other than between the first electrically conductive path and the second electrically conductive path.

12. The inductor device of claim 1, wherein the first gap crosses a concentric path disposed around the first electrically conductive path, the concentric path operative to convey the first magnetic flux generated by the first current flowing through the first electrically conductive path; and
wherein dimensions of the first gap tunes an inductance and saturation associated with a respective inductance provided by the first electrically conductive path.

13. The inductor device of claim 1, further comprising:
a first pair of electrically conductive paths disposed in the core material, each of the electrically conductive paths in the first pair extending from the proximal end to the distal end, the first pair of electrically conductive paths including the first electrically conductive path and a second electrically conductive path; and
a second pair of electrically conductive paths disposed in the core material, each of the electrically conductive paths in the second pair extending from the proximal end to the distal end, the second pair of electrically conductive paths including a third electrically conductive path and a fourth electrically conductive path.

14. The inductor device as in claim 1 further comprising:
a second electrically conductive path extending through the core material from the proximal end of the inductor device to the distal end of the inductor device, the core material operable to confine second magnetic flux generated from second current flowing through the second electrically conductive path; and
wherein the second electrically conductive path is spaced apart from the first electrically conductive path, wherein the gap extends from the first electrically conductive path radially outward from the first electrically conductive path in a direction away from a region of the core material between the first electrically conductive path and the second electrically conductive path.

15. An apparatus comprising:
an inductor device having a proximal end and a distal end, the inductor device comprising: i) core material, the core material being magnetically permeable; ii) a first electrically conductive path extending through the core material from the proximal end of the inductor device to the distal end of the inductor device, the core material operable to confine first magnetic flux generated from first current flowing through the first electrically conductive path; and iii) a gap disposed in the core material, the gap having a different magnetic permeability than the core material;
a substrate;
the inductor device affixed to the substrate; and
a first circuit component affixed to the inductor device, the inductor device conveying energy from a voltage source on the substrate to the first circuit component.

16. A method comprising:
receiving a substrate;
receiving a first circuit component including an inductor device, the inductor device having a proximal end and a distal end, the inductor device comprising: i) core material, the core material being magnetically permeable; ii) a first electrically conductive path extending through the core material from the proximal end of the inductor device to the distal end of the inductor device, the core material operable to confine first magnetic flux generated from first current flowing through the first electrically conductive path; and iii) a gap disposed in the core material, the gap having a different magnetic permeability than the core material, the inductor device extending through the first circuit component;

affixing the first circuit component to the substrate;

receiving a second circuit component; and affixing the second circuit component to the first circuit component, the inductor device operative to convey energy from a voltage source on the substrate to the second circuit component.

17. The inductor device of claim 3, wherein the first electrically conductive path is a first inductor phase of an N-phase direct coupled inductor; and wherein the second electrically conductive path is a second inductor phase of the N-phase direct coupled inductor.

18. The inductor device of claim 17, wherein the core material has a relative magnetic permeability of greater than 80.

19. The inductor device of claim 18, wherein a magnetic coupling factor between the first electrically conductive path and the second electrically conductive path is less than 10%.

20. The inductor device of claim 3, wherein the first gap controls a magnetic coupling factor between the second electrically conductive path and the first electrically conductive path.

21. The inductor device of claim 1, wherein the core material has a relative magnetic permeability of greater than 80.

22. The inductor device of claim 1 further comprising:

a second electrically conductive path residing in a second void of the core material and extending through the second void of the core material from the proximal end of the inductor device to the distal end of the inductor device, the core material operable to confine second magnetic flux generated from second current flowing through the first second electrically conductive path; and wherein a magnetic coupling factor between the first electrically conductive path and the second electrically conductive path is less than 10%.

23. A method comprising:

receiving a substrate;

receiving a first circuit component including an inductor device, the inductor device having a proximal end and a distal end, the inductor device comprising: i) core material, the core material being magnetically permeable; ii) a first electrically conductive path extending through the core material from the proximal end of the inductor device to the distal end of the inductor device, the core material operable to confine first magnetic flux generated from first current flowing through the first electrically conductive path; and iii) a gap disposed in the core material, the gap having a different magnetic permeability than the core material;

the inductor device extending through the first circuit component;

embedding the first circuit component into the substrate;

receiving a second circuit component; and affixing the second circuit component to the first circuit component, the inductor device conveying energy from a voltage source on the substrate to the second circuit component.

24. The inductor device as in claim 1, wherein a first portion of the core material encompasses the first electrically conductive path except for a thickness of the first gap where the core material is absent.

25. The inductor device as in claim 24, wherein a thickness of the first gap is less than a diameter of the first electrically conductive path.

26. The inductor device as in claim 1, wherein a thickness of the first gap is less than a diameter of the first electrically conductive path.

27. The inductor device as in claim 1, wherein the first gap extends between the first electrically conductive path and a first surface of the core material.

28. The inductor device as in claim 1 further comprising:

a second electrically conductive path residing in a second void of the core material, the second electrically conductive path extending through the second void of the core material from the proximal end of the inductor device to the distal end of the inductor device, the core material operable to confine second magnetic flux generated from second current flowing through the second electrically conductive path;

a second gap disposed in the core material, the second gap having a different magnetic permeability than the core material; and the second electrically conductive path being an only electrically conductive path disposed in the second void.

29. The inductor device as in claim 28, wherein the first gap extends radially outward from the first electrically conductive path through the core material in an opposite direction of the second electrically conductive path.

30. The inductor device as in claim 29, wherein the second gap extends radially outward from the second electrically conductive path through the core material in an opposite direction of the first electrically conductive path.

31. The inductor device as in claim 30, wherein the first gap extends between the first electrically conductive path and a first surface of the core material; and wherein the second gap extends between the second electrically conductive path and a second surface of the core material.

32. The inductor device as in claim 31 further comprising:

a conductor path disposed at the distal end of the inductor device, the conductor path coupling the first electrically conductive path to the second electrically conductive path.

* * * * *

UNITED STATES PATENT AND TRADEMARK OFFICE
CERTIFICATE OF CORRECTION

PATENT NO. : 11,735,352 B2
APPLICATION NO. : 16/925729
DATED : August 22, 2023
INVENTOR(S) : Danny Clavette et al.

It is certified that error appears in the above-identified patent and that said Letters Patent is hereby corrected as shown below:

In the Claims

Claim 11, Line 6, replace "aft" with --air--
Claim 14, Line 10, replace "the gap" with --the first gap--

Signed and Sealed this
Thirty-first Day of October, 2023

Katherine Kelly Vidal
*Director of the United States Patent and Trademark Office*